United States Patent
Chung

(10) Patent No.: US 9,184,562 B2
(45) Date of Patent: Nov. 10, 2015

(54) HYBRID VERTICAL-CAVITY LASER

(75) Inventor: Il-Sug Chung, Lyngby (DK)

(73) Assignee: DANMARKS TEKNISKE UNIVERSITET, Lyngby (DK)

( * ) Notice: Subject to any disclaimer, the term of this patent is extended or adjusted under 35 U.S.C. 154(b) by 237 days.

(21) Appl. No.: 13/148,911

(22) PCT Filed: Jan. 22, 2010

(86) PCT No.: PCT/DK2010/050015
§ 371 (c)(1),
(2), (4) Date: Sep. 22, 2011

(87) PCT Pub. No.: WO2010/091688
PCT Pub. Date: Aug. 19, 2010

(65) Prior Publication Data
US 2012/0008658 A1    Jan. 12, 2012

Related U.S. Application Data

(60) Provisional application No. 61/151,631, filed on Feb. 11, 2009.

(30) Foreign Application Priority Data

Feb. 25, 2009 (EP) ..................... 09153659

(51) Int. Cl.
*H01S 5/183*   (2006.01)
*H01S 5/10*    (2006.01)
(Continued)

(52) U.S. Cl.
CPC . *H01S 5/10* (2013.01); *H01S 5/021* (2013.01); *H01S 5/026* (2013.01); *H01S 5/0215* (2013.01);
(Continued)

(58) Field of Classification Search
CPC . H01S 5/18305; H01S 5/18319; H01S 5/105; H01S 5/18361; H01S 5/18377
USPC ........................... 372/50.11, 50.124; 438/31; 257/E21.158
See application file for complete search history.

(56) References Cited

U.S. PATENT DOCUMENTS 6,031,243 A    2/2000  Taylor
6,829,286 B1  12/2004  Guilfoyle et al.
(Continued)

FOREIGN PATENT DOCUMENTS

EP    0 952 472       10/1999
JP    2002-543452     12/2002
(Continued)

OTHER PUBLICATIONS

Witzens et al., "Monolithic Integration of Vertical-Cavity Surface-Emitting Lasers with In-Plane Waveguides," 2005, Appl. Phyx. Lett. 86, 101105, 1-3.*

(Continued)

*Primary Examiner* — Joshua King
(74) *Attorney, Agent, or Firm* — Pearl Cohen Zedek Latzer Baratz LLP

(57) ABSTRACT

The present invention provides a light source (2) for light circuits on a silicon platform (3). A vertical laser cavity is formed by a gain region (101) arranged between a top mirror (4) and a bottom grating-mirror (12) in a grating region (11) in a silicon layer (10) on a substrate. A waveguide (18, 19) for receiving light from the grating region (11) is formed within or to be connected to the grating region, and functions as an 5 output coupler for the VCL. Thereby, vertical lasing modes (16) are coupled to lateral in-plane modes (17, 20) of the in-plane waveguide formed in the silicon layer, and light can be provided to e.g. photonic circuits on a SOI or CMOS substrate in the silicon.

19 Claims, 14 Drawing Sheets

(51) Int. Cl.
  *H01S 5/02* (2006.01)
  *H01S 5/026* (2006.01)
  *H01S 5/30* (2006.01)

(52) U.S. Cl.
  CPC .............. *H01S 5/105* (2013.01); *H01S 5/1032* (2013.01); *H01S 5/1838* (2013.01); *H01S 5/18311* (2013.01); *H01S 5/18341* (2013.01); *H01S 5/18366* (2013.01); *H01S 5/3095* (2013.01)

(56) References Cited

U.S. PATENT DOCUMENTS

| | | | |
|---|---|---|---|
| 7,304,781 | B2 | 12/2007 | Chang-Hasnain et al. |
| 8,116,171 | B1 * | 2/2012 | Lee ............................ 369/13.01 |
| 8,257,990 | B2 * | 9/2012 | Koch .............................. 438/31 |
| 8,422,342 | B1 * | 4/2013 | Lee ............................ 369/13.33 |
| 8,451,695 | B2 * | 5/2013 | Olson ......................... 369/13.01 |
| 2004/0036134 | A1 * | 2/2004 | Li .................................. 257/432 |
| 2004/0086249 | A1 * | 5/2004 | Zoorob .......................... 385/129 |
| 2007/0153860 | A1 | 7/2007 | Chang-Hasnain et al. |
| 2007/0170417 | A1 * | 7/2007 | Bowers ........................... 257/14 |
| 2007/0201526 | A1 | 8/2007 | Hori |
| 2007/0291805 | A1 | 12/2007 | Ledentsov et al. |
| 2010/0142580 | A1 | 6/2010 | Gilet et al. |

FOREIGN PATENT DOCUMENTS

| | | |
|---|---|---|
| WO | WO 2005/089098 | 9/2005 |
| WO | WO 2007/071794 | 6/2007 |
| WO | WO 2008/068209 | 5/2008 |

OTHER PUBLICATIONS

Fang et al., "Electrically pumped hybrid AlGaInAs—silicon evanescent laser", Optics Express vol. 14, No. 20, pp. 9203-9210, Oct. 2, 2006.
Gunn et al, "Silicon Photonics Poised to Invade Local Area Networks", Photonics Spectra, pp. 62-67, Mar. 2006.
Chung et al., "Subwavelength grating-mirror VCSEL with a thin oxide gap", IEEE Photonics Technology Letters, vol. 20, No. 2, pp. 105-107, Jan. 15, 2008.
Yang L et al., "Topology optimization of slow light coupling to photonic crystal waveguides", Electronic Letters, vol. 13, No. 17, pp. 923-924, Aug. 16, 2007.
Yang et al., "Edge-emitting quantum well laser with Bragg reflectors", Applied Physics Letters, vol. 66, No. 22, pp. 2949-2951, May 29, 1995.
Jones et al., "Grating based hybrid silicon lasers", Proceedings of SPIE, vol. 7230, pp. 72300U-1-72300U-8, Feb. 3, 2009.
Wu, H. et al., "Ultra broadband SOI binary blazed grating mirror", 5$^{th}$ IEEE International Conference on Group IV Photonics, pp. 299-301, Sep. 17, 2008.
Huang, M.C.Y., et al., "Nano electro-mechanical optoelectronic tunable VCSEL", Optics Express, vol. 15, No. 3, pp. 1222-1227, Feb. 5, 2007.
Huang, M.C.Y., et al., "Monolithic Integrated Piezoelectric MEMS-Tunable VCSEL", IEEE J. Selected Topics in Quant. Electron., vol. 13, No. 2, pp. 374-380, Mar./Apr. 2007.
Maute, M. et al., "MEMS-Tunable 1.55 um VCSEL with Extended Turning Range Incorporating a Buried Tunnel Junction", IEEE Photon. Technol. Lett., vol. 18, No. 5, pp. 688-690, Mar. 1, 2006.
Ferrier, L. et al., "Vertical microcavities based on photonic crystal mirrors for III-V/Si integrated microlasers", Photonic Crystal Materials and Devices VIII, Proc. of SPIE, vol. 6989, pp. 6989W-1-6989W12, Apr. 8, 2008.
Drouard et al., "Coupling between refractive waveguides and two dimensional photonic crystal Bloch modes", Proceedings SPIE Photonics West, Photonic Crystal Materials and Devices VI, vol. 6901, pp. 69011B-1-69011B-9, 2008.
International Search Report for International Application No. PCT/DK2010/050015 dated Apr. 8, 2010.
International Preliminary Report on Patentability for International Application No. PCT/DK2010/050015 dated Apr. 8, 2011.
Drouard et al., Coupling between refractive waveguides and two dimensional photonic crystal Bloch modes, Jun. 16, 2010, p. 69011B-1-9, vol. 6901, Proc. of SPIE, Downloaded from SPIE Digital Library.

* cited by examiner

HYBRID VERTICAL-CAVITY LASER

CROSS-REFERENCE TO RELATED APPLICATIONS

This application is a National Phase Application of PCT International Patent Application No. PCT/DK2010/050015, International Filing Date Jan. 22, 2010, which claimed priority from U.S. Provisional Patent Application No. 61/151,631, filed Feb. 11, 2009 and European Patent Application No. 09153659.9, filed Feb. 25, 2009, both of which are incorporated by reference herein.

FIELD OF THE INVENTION

The present invention relates to providing light to photonic circuits on a silicon platform that is compatible with matured silicon processing technologies. In particular, the invention relates to providing light to such circuitry by use of a grating-mirror vertical-cavity laser.

BACKGROUND OF THE INVENTION

The challenge of integrating small and efficient electrically pumped light sources in silicon based photonic circuitry is well known.

Gunn (Photonics Spectra March 2006, pp. 62-67) described this challenge and proposes a solution where light is provided from non-integrated external laser sources. Through an optical fibre, the light is directed to an integrated holographic lens and thereby coupled to an integrated waveguide. This approach has the disadvantages that tedious alignment and subsequent packaging is necessary.

Fang et al. (Optics Express 14, pp. 9203 (2006)) describes an edge-emitting electrically pumped AlGaInAs-silicon evanescent laser architecture. The architecture is wafer bonded to a silicon on insulator (SOI) substrate and the laser cavity is defined solely by a silicon waveguide in the underlying SOI substrate. While solutions based on edge-emitting lasers provides easier coupling to photonic circuitry, they have the disadvantages of relatively high power consumption and non-intrinsic single mode control.

Hence, an improved way of integrating light sources on silicon platforms would be advantageous, and in particular a more efficient and/or reliable ways of providing light to photonic circuits would be advantageous.

SUMMARY OF THE INVENTION

It is an object of the present invention to provide an alternative to the prior art.

In particular, it may be seen as an object of the present invention to provide a method and a hybrid vertical-cavity laser (hybrid VCL) structure that solve the above mentioned problems of the prior art with providing light to photonic circuits.

Thus, the above described object and several other objects are intended to be obtained in a first aspect of the invention by providing a method for making various hybrid VCL structure on a silicon platform using a bottom grating mirror in the silicon platform, the method comprising:

providing a layered structure comprising an active region formed in III-V materials and a highly reflective top mirror;
forming a grating region in a silicon layer supported by a layer with lower refractive index than the silicon layer, the grating region comprising a one-dimensional (1D) or two-dimensional (2D) periodic refractive index grating formed by silicon layer parts and regions being formed in the silicon layer and having lower refractive indices than the silicon layer;
forming a waveguide in the silicon layer, the waveguide being arranged to facilitate lateral out-coupling of light from the grating region to the waveguide, this may be obtained by forming the within and/or to be connected to, such as abutting, the grating region; and
arranging the layered structure on the grating region, comprising providing a layer with a refractive index lower than the refractive index of the silicon layer between the layered structure and the grating region, whereby the periodic refractive index grating establishes a bottom grating mirror to form a VCL cavity between the top mirror and the grating region. The waveguide is preferably laterally oriented with respect to the VCL cavity and functions as an out-coupling waveguide for the VCL.

In the following, a number of further aspects, preferred and/or optional features, elements, examples and implementations will be described. Features or elements described in relation to one embodiment or aspect may be combined with or applied to the other embodiments or aspects where applicable. For example, structural and functional features applied in relation to the hybrid VCL structure may also be used as features in relation to the method for hybrid VCL structure by proper adaptation and vice versa. Also, Explanations of underlying mechanisms of the invention as realized by the inventor are presented for explanatory purposes, and should not be used in ex post facto analysis for deducing the invention.

The structure comprising the highly reflective top mirror, the active region and the bottom grating-mirror is referred to both as a "grating mirror vertical-cavity laser (GMVCL) structure" and as a VCL structure with, or formed using, a bottom grating-mirror. Within the meaning of the present description, these terms have the same meaning. Also, The layered structure comprising the highly reflective top mirror and the active region, but without the bottom grating mirror, is referred to as a "partial VCL structure" or simply the "layered structure", depending on the context.

The hybrid VCL structure emits light laterally to the in-plane waveguide while the vertical-cavity surface-emitting laser (VCSEL) emits vertically from a mirror surface to the air. Hence, the hybrid VCL is a structure comprising a top mirror being highly reflective so as not to function as an output coupler, an active region formed in III-V materials, and a silicon-based grating region forming a highly reflective bottom grating-mirror for creating a VCL cavity with the top mirror, as well as a laterally oriented waveguide for emission of light from the VCL cavity to the outer photonic circuit in the silicon substrate.

An example of a prior art VCSEL using two dimensional (2D) grating mirrors can be found in e.g. US 2007/0201526. This structure differs from the present invention in several ways, one of them being that one of the end mirrors has a reduced reflectivity in order to function as an output coupler, making the laser surface emitting. Further, US 2007/0201526 provides no in-plane waveguide structure in the layer holding the 2D grating structure intended to laterally output light. None the less, the technology is similar and extensive references to VCSEL technology is made throughout the present description. The invention is thereby also advantageous as it applies matured VCSEL technologies exhibiting very low power consumption, eminent single-mode property and mode control in general. Further, the use of VCSEL technology allows for uncomplicated packaging.

It is preferred that the ways of obtaining optical and electrical confinement in the partial VCL structure provide relaxed alignment tolerance during the hybridisation, i.e. they do not rely on the exact positioning of the partial VCL structure on the bottom grating mirror, or in other words, the bottom grating mirror does not contribute or play a role in the obtaining of optical and electrical confinement.

The top mirror is not used as an out-coupling mirror as in regular top-emission type VCSELs, and therefore has a higher reflectivity than normal out-coupling mirrors of VCSELs. It is preferred that the top mirror has a reflectivity as close to 100% as possible, e.g., higher than 99.95% in the case of absence of doping. The top mirror may be a distributed Bragg reflector (DBR), a grating mirror, a mixture of these two, or any other type of reflector. The top mirror can be epitaxially grown together with the active region, wafer-bonded to the active region, or deposited on to the active region, depending on the choice of materials and the method of obtaining optical and electrical confinements.

The invention applies a grating mirror as the bottom reflector to establish the VCL cavity and as a router or coupler to deliver a fraction of incoming light to the in-plane waveguide. Highly reflective grating mirrors can be categorized into two types, according to the reflection mechanism. In one type, the resonance coupling of incident vertically-propagating free-space modes and laterally-propagating photonic bandgap (PBG) modes of grating is involved in the reflection process, while it is not in the other type. Even though both types can provide a reflectivity close to 100%, only the PBG mode-involved type can function as both a reflector and a router/coupler, and is thus the one preferably applied in the present invention. In this grating mirror type, the light in the incident free space mode is diffracted in the grating; part of the diffracted light is coupled to the preferably Γ (gamma)-point slow light PBG mode; the light in the PBG mode propagates laterally in the grating and is coupled back to the free space mode. This coupling process may result in resonance. In the absence of the in-plane waveguide within or connected to the grating mirror, this resonance coupling process can result in a reflectivity close to 100%. If an out-coupling waveguide is formed within and/or to be connected to the grating region, the PBG mode of the grating can be feasibly coupled to the waveguide mode; this provides a high routing/coupling efficiency of e.g., about −3 dB which is comparable to the coupling efficiency of a state-of-the-art holographic grating coupler. However, in the other type of grating mirror not involving PBG modes, the light in the free space mode is diffracted in the grating but is not as strongly coupled to the PBG mode; thus, routing efficiency is lower.

The waveguide, also referred to as the in-plane, out-coupling waveguide, is formed in the silicon layer and preferably comprises a grating waveguide (GWG) in the grating region and an index contrast waveguide (ICWG) outside the grating region. The GWG is an intermediate waveguide to facilitate extracting fraction of light from PBG mode to ICWG mode. By optimizing the topology of GWG and the connecting part of GWG and ICWG, the routing efficiency can be further increased higher than −3 dB. It is preferred that the bottom grating mirror with a lateral waveguide has a reflectivity of about 99.5% and a routing efficiency of −3 dB. This reflectivity value is comparable to the reflectivity of a vertically outputting mirror of the regular VCSELs.

The routing function of the grating mirror is quite different from the coupling function of regular grating couplers. In the grating mirror of the present invention, a very small fraction of incident light is routed to the in-plane waveguide while most of incident light is reflected. For example, 99.5% of the incident light is reflected while 0.25% is output to the waveguide, when the grating mirror has a reflectivity of 99.5% and a routing efficiency of −3 dB. On the contrary, in a state-of-the-art holographic grating coupler, −3 dB, i.e., 50% of the incident light is coupled to the waveguide (Photonics Spectra March 2006, pp. 62-67).

This combination of a highly reflective grating mirror involving resonance coupling with PBG modes and an in-plane output coupler in the form of the waveguide formed within or to be connected to the grating region is new. Most of seemingly-similar grating structures reported so far, are different from the grating mirror of the present invention in the aspects of structural shape, function, or reflection process (involvement of slow light modes). For example:

in US 2007/0153860, I.-S. Chung et al. (IEEE Photonic. Tech. Lett. 20, 1041 (2008)), and WO 2005/089098, the reflection do not involve resonance coupling with slow light PBG modes;

In US 2000/6031243, the grating does not work as a reflector;

In US 2007/0201526, the grating mirror has no waveguide connected for lateral output and the slow light PBG mode locates far from the Γ (gamma) point in the dispersion diagram;

In R. Jones et al. ("Grating based hybrid silicon lasers", Proceedings of SPIE, vol. 7230, pp 72300U-1), the grating is used to select a lasing frequency, and does not function as reflector nor router;

In H. Wu et al. ("Ultra broadband SOI binary blazed grating mirror", 5th IEEE International Conference on Group IV Photonics, pp 299-301), the grating is surface grating, i.e., the bottom of the grating is not supported by a lower refractive index material. Thus, its reflectivity does not exceed 99% which is insufficient for lasing.

The invention is particularly, but not exclusively, advantageous for providing light to photonic circuits using a hybrid VCL structure that is hybridised on a silicon platform in a way that is less sensitive to aligning error than many prior art solutions. This is advantageous as it provides for an easier and thereby cheaper alignment during assembly of the different parts.

The invention is also advantageous as it applies one dimensional (1D) or two dimensional (2D) passive grating and preferably also a grating waveguide. In the literature, 2D grating and grating waveguide are often called photonic crystal (PhC) and photonic crystal waveguide (PhCWG), respectively. To avoid confusion, hereafter, PhC and PhCWG are called 2D grating and GWG, respectively.

Hybridising is the act of mixing different species or varieties to produce hybrids. In the present context, it means connecting, physically and functionally, structures formed in materials from group III and V in the periodic table of the elements (hereafter group III-V materials) with structures formed in group IV materials. Similarly, a hybridised structure is a structure formed in group III-V materials connected to a structure formed in group IV materials, or vice versa. The connection is typically made by wafer bonding techniques, and it is preferred that the III-V active region of the partial VCL structure is wafer-bonded to the silicon-based grating region. Other connecting techniques also can be utilized if adequate for the application of interest.

In the following, the term hybridised VCL means the structure obtained when the layered structure comprising the highly reflective top mirror and the active region (group III-V materials) are connected to the grating region (group IV materials). The establishment of this connection provides both a VCL (as the grating region provides the bottom mirror) and a hybridised structure in accordance with the above definitions. However, for the sake of ensuring compliance with other well established terms in the field, a "hybrid VCL" is also referred to as a "hybridised VCL structure" with the specification that this is done using a grating mirror. Within the meaning of the present description, this has the same meaning.

As the person skilled in the art will understand, the silicon layer may be several separated silicon layer parts arranged on a substrate, some parts potentially in different levels. Also, it will be understood that although silicon is the preferred method of the current technology, other materials, such as other type IV-materials, IV material compositions, or high-refractive-index material, exhibiting similar properties may substitute silicon in respect of the present invention.

In a second aspect, the invention provides a hybridised VCL structure comprising:

a layered structure comprising an active region formed in group III-V materials and a highly reflective top mirror that is not used as an out-coupling mirror and that has a reflectivity preferably higher than 99.95%; and a grating region formed in a silicon layer supported by a layer with lower refractive index, the grating region comprising a 1D or 2D periodic refractive index grating formed by silicon layer parts and regions being formed in the silicon layer and having refractive indices lower than the refractive index of the silicon layer;

a layer with refractive index lower than the refractive index of the silicon layer provided on top of the grating region of the silicon layer;

where the layered structure is arranged on the grating region so that the periodic refractive index grating establishes a bottom grating-mirror forming a VCL cavity between the top mirror and the grating region, the bottom grating-mirror also facilitating coupling of light in vertical modes of the VCL cavity to in-plane modes of the grating region, and a waveguide formed in the silicon layer and arranged to facilitate coupling of light from the grating region to the waveguide.

A third aspect relates to the silicon-based substrate with grating region from the second aspect, but provided alone. Thus, in a third aspect, the invention provides a silicon-based grating mirror with a laterally oriented waveguide comprising a silicon layer being supported by a layer with lower refractive index;

a grating region comprising a 1D or 2D periodic refractive index grating formed by silicon layer parts and regions being formed in the silicon layer that have refractive indices lower than the refractive index of the silicon layer;

at least part of the grating region forming a grating-mirror for reflecting normally incident light and couple normally incident light to in-plane modes of the grating region; and a waveguide formed in the silicon layer and arranged to facilitate coupling of light from in-plane modes of the grating region to the waveguide.

Any layer formed on top of the grating region, such as the low index layer, is transparent for lasing wavelength. For example, the lasing wavelengths can be 1.1, 1.3, and 1.55 µm.

During fabrication processing of the device, the reflectivity of the grating mirror can be adjusted by lithographically changing the grating design, i.e., thickness, periodicity, air filling ratio, and pattern shape of the grating, while the lasing wavelength of the GMVCL may be adjusted by changing the thickness of a low index layer above the silicon grating.

In a fourth aspect, the partial VCL structure and substrate with grating region from the second aspect are provided together as individual, unassembled structures. Hence, in the third aspect, the invention provides a partial VCL structure as described in the second aspect and a silicon layer as described in the second aspect, but as a kit for assembly instead of a connected structure.

Additionally or alternatively, the fourth aspect may provide a layered structure and a silicon layer for receiving the layered structure;

the layered structure comprising an active region formed in group III-V materials and a highly reflective top mirror that is not used as an out-coupling mirror and that has a reflectivity close to 100%, e.g., higher than 99.95%;

the silicon layer being supported by a layer with lower refractive index and comprising a grating region comprising a 1D or 2D periodic refractive index grating formed by silicon layer parts and regions being formed in the silicon layer and having refractive indices lower than the refractive index of the silicon layer; and a waveguide formed in the silicon layer and arranged to facilitate coupling of light from the grating region to the waveguide;

where at least one of the layered structure or the grating region comprises or involves a structuring that will provide a layer with refractive index lower than the refractive index of the silicon layer above the grating region when the layered structure is arranged on the grating region.

In some embodiments, the GWG in the grating region may be omitted so that the coupling is directly from the in-plane PBG mode of the periodic refractive index grating to a waveguide formed outside the grating region, such as an index contrast waveguide. This may, however decrease the coupling efficiency.

It is preferred that an embodiment of the method comprises coupling of light from the VCL cavity to in-plane PBG modes of the grating region. The hybridised structure thereby serves the function of efficiently providing light to in-plane grating modes in a silicon layer, which is advantageous for providing light to a photonic circuit on a silicon platform.

The coupling to the ICWG may be facilitated through an intermediate GWG, preferably formed within the grating region. In this embodiment, it is preferred that an embodiment of the method further comprises coupling of light from the in-plane PBG modes of the grating region to waveguide modes of a GWG formed in the silicon layer, preferably within the grating region. This arranging may be realised by ensuring a partial overlap between the GWG and VCL cavity modes in the bottom grating-mirror appearing when the VCL emits light and by designing the geometry of GWG so that the mode dispersion of GWG modes be similar as or adiabatically being transformed to that or those of the PBG modes.

Optimizing the topology of the GWG and connect part of the GWG and ICWG may be preferred in order to further decrease the unwanted scattering loss during the mode coupling/routing, increasing the overall routing efficiency.

It is further preferred that definition of an optical gain region of the VCL is performed after arranging of the partial VCL structure on the silicon layer. This provides the advantage that the optical gain region can be defined to have the desired overlap with the periodic refractive index grating after the assembly, typically performed by wafer bonding, where they do no more move in relation to each others. This means that little or no aligning effort is necessary during the assembly. The position of the optical gain region of the VCL involves defining a current aperture or similar for directing charge carriers to a delimited part of the active region of the VCL structure.

The present invention provides a light source for photonic circuits on a silicon platform in a cheap, compact and efficient way. The basic idea of the invention is to form a vertical laser cavity between a top mirror and a active region based on standard VCSEL technology, and a bottom mirror being a refractive index grating-mirror formed in a silicon layer on a substrate. The grating mirror in the silicon layer is so designed that the reflection process in the grating mirror includes the conversion of vertical resonant mode to in-plane PBG modes of the grating mirror. By providing coupling of the in-plane PBG modes to an in-plane waveguide, light can be provided to e.g. in-plane photonic circuits on a SOI/CMOS substrate. All the fabrication process can be performed using matured III-V VCSEL technology and silicon technology.

These and other aspects of the invention will be apparent from the following description with reference to the described embodiments.

BRIEF DESCRIPTION OF THE FIGURES

Embodiments of the invention will now be described in more detail with regard to the accompanying figures. The figures show one way of implementing the present invention and is not to be construed as being limiting to other possible embodiments falling within the scope of the attached claim set.

FIG. 1 is schematic illustrations of a hybridised VCL on a SOI substrate according to an embodiment of the invention.

DETAILED DESCRIPTION OF THE INVENTION

Figure 1A:
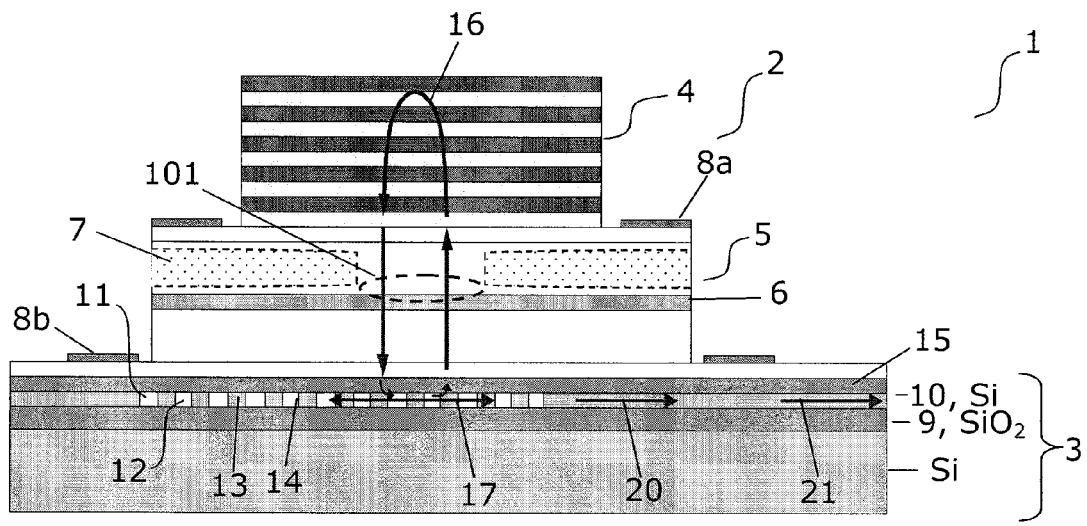
FIG. 1A shows the assembled structure in a profile view.

FIGS. 1A and B illustrate a hybridized grating-mirror vertical-cavity laser (VCL) structure as well as a method for hybridising a grating-mirror vertical-cavity laser (VCL) structure on a silicon platform, according to preferred embodiments of the present invention.

Figure 1B:
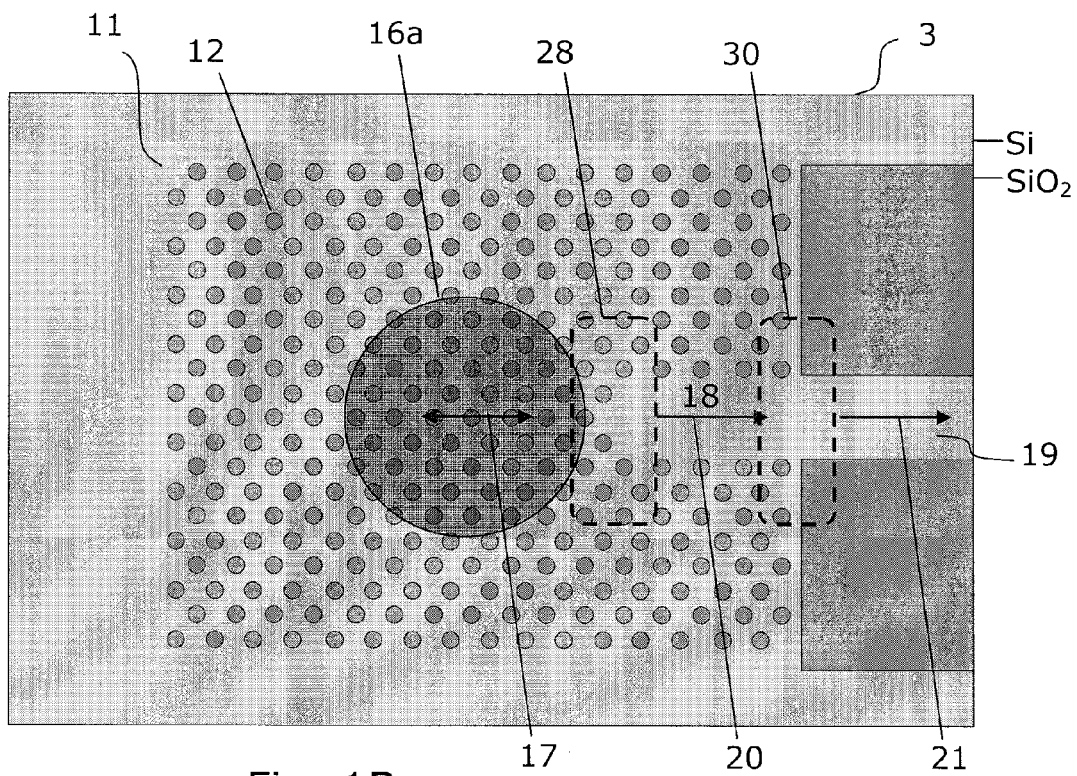
FIGS. 1B, 1C and 1D show the SOI substrate from a top view, illustrating areas of further optimization and different embodiments for the waveguide.
Figure 1C:
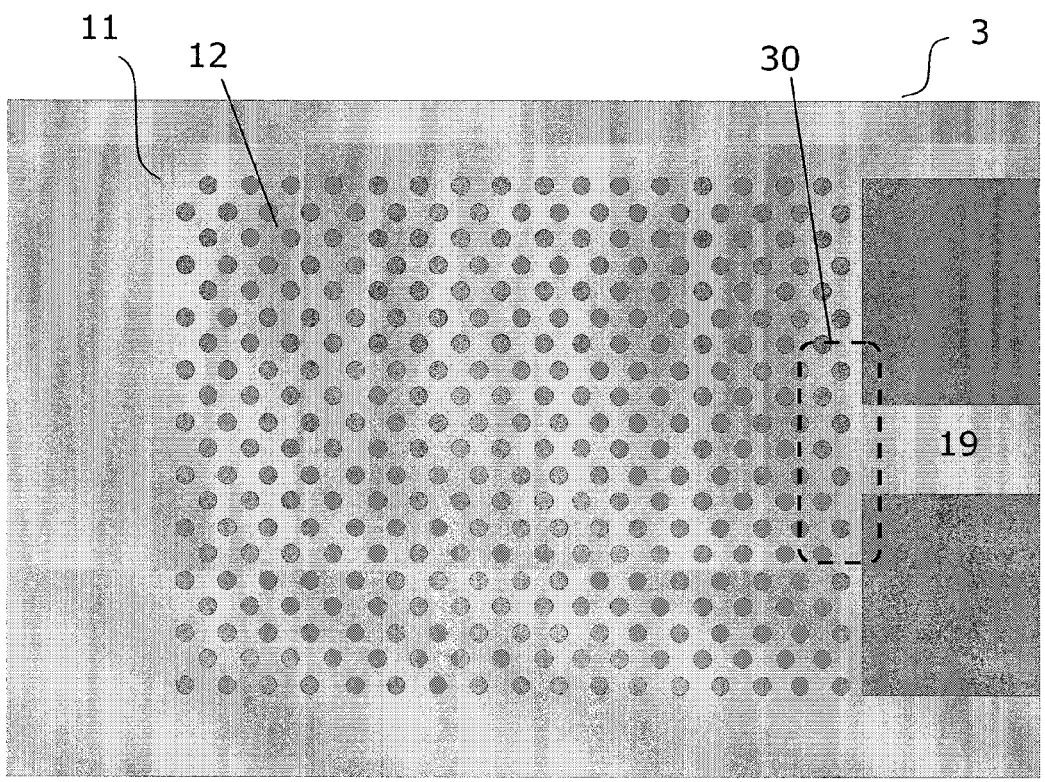
Figure 1D:
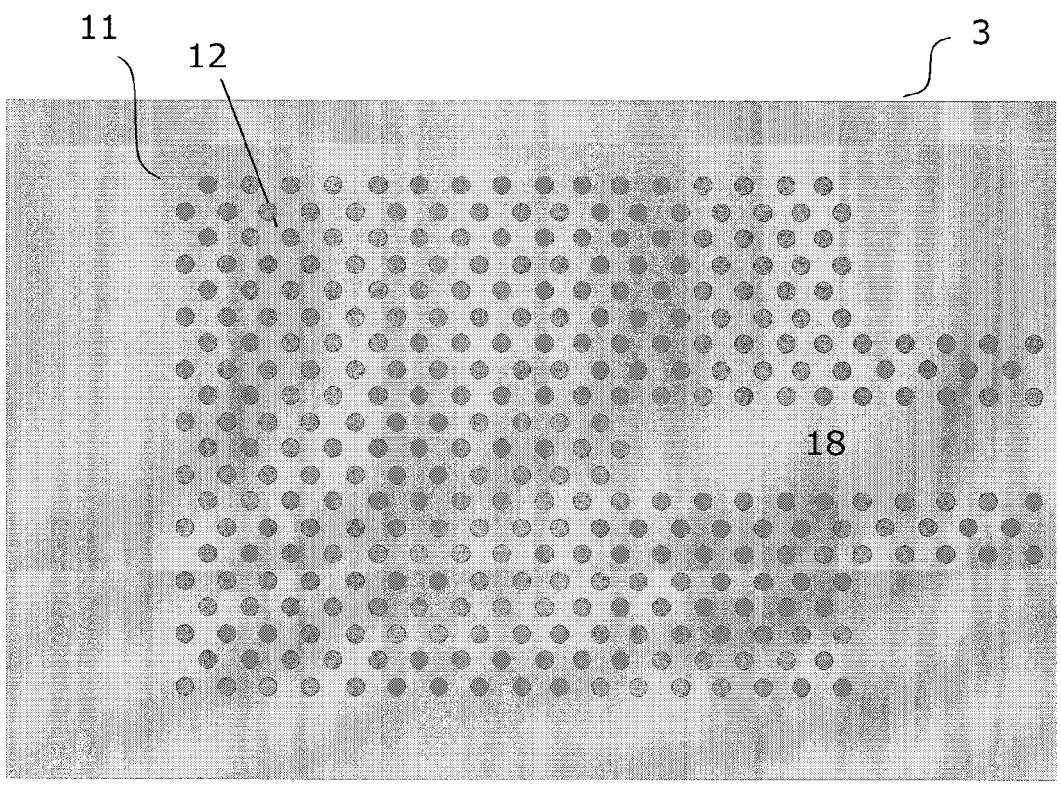

First, an assembled structure and operating principles are described in relation to FIGS. 1A-C. In FIG. 1A, a hybridised VCL structure 1 is shown, comprising a partial VCL structure 2 and a silicon platform substrate 3.

The partial VCL structure 2 comprises a highly reflective top mirror 4, here embodied by a distributed Bragg reflector (DBR) being a stack of alternating layers with different refractive indices. DBRs are commonly used top mirrors for VCSEL and their reflectivity can be finely tuned, and can be formed in III-V materials as well as other materials including $SiO_2$.

For normal VCSELs, the top mirror serves as the out-coupling mirror, and typically has a reflectivity higher than 99% but lower than the reflectivity of a bottom mirror. In the present hybrid VCL, the top mirror is not used as an out-coupling mirror and should therefore be highly reflecting. Such highly reflective top mirror 4 of the hybrid VCL preferably has a reflectivity larger than 99.5%, such as larger than 99.9%, such as 99.95%. The optimal value of the reflectivity of top mirror 4 should be determined considering the reflectivity of the grating mirror 12, one pass gain in the quantum wells (QWs), and the targeted differential quantum efficiency.

The partial VCL structure 2 further comprises an active region 5 formed in III-V materials. The active region 5 can be formed as any applicable VCSEL active region, and typically comprises a series of epitaxially grown III-V material layers. A typical design includes upper and lower confinement layers sandwiching a QW structure 6 consisting of alternating QW layers (e.g. InAlGaAs or InGaNAs for wavelengths longer than >1.3 µm, and GaAs for 850-nm wavelength) and barriers.

The partial VCL structure 2 can in one embodiment be provided by a standard VCSEL structure, excluding the bottom mirror and with a highly reflective top mirror.

The embodiment of the hybrid VCL shown in FIG. 1A, electric contacts 8a and 8b are situated just above and just below the active region 5. This contact scheme is called intra-cavity contact. In the intra-cavity contact case, the top mirror 4 can be undoped. If necessary, the electric contact 8a can be made on top of the top mirror 4. This contact scheme is called extra-cavity contact. In the extra-cavity contact case, the top mirror should be appropriately doped.

Obtaining Optical and Gain Confinements

In the following, a number of possible ways of defining the position of the optical gain region and the optical mode in the GMVCL is described in relation to FIGS. 1-7. Elements of the GMVCL not described are assumed to be similar to those described above in relation to FIGS. 1A and B.

In the embodiment of the hybrid VCL shown in FIG. 1A, the optical confinement is provided by a current aperture formed by proton implantation, so that the optical mode is defined by the thermal lensing effect. The region 7 implanted by protons becomes insulating, working as a current aperture and defining the gain region 101.

Figure 2:
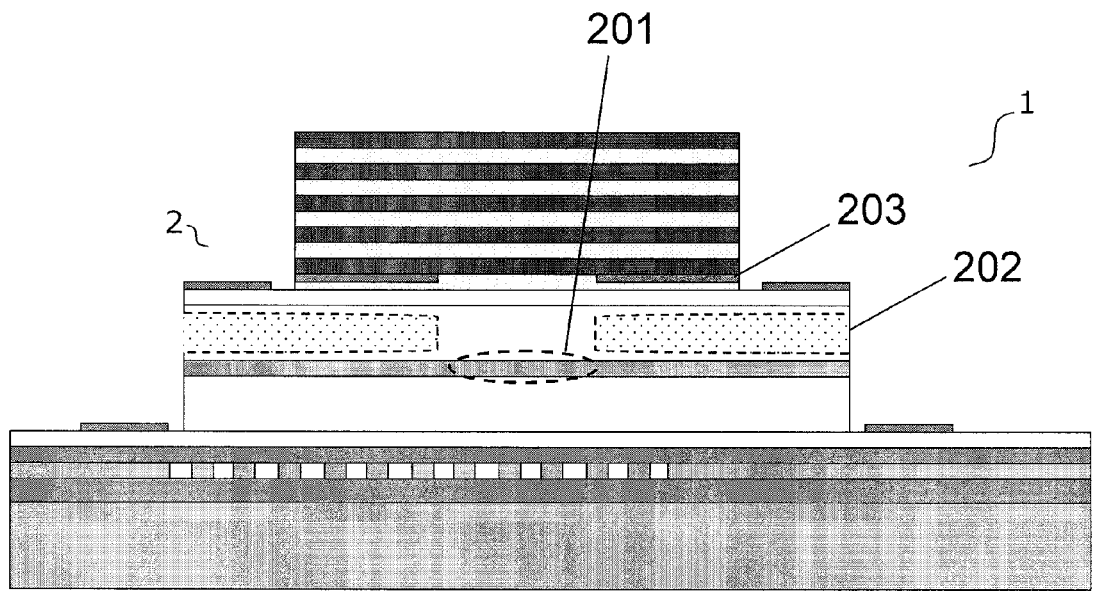
FIGS. 2-7 show four different confinement schemes for optical mode confinement and gain/electrical confinement.

In the embodiment of the hybrid VCL shown in FIG. 2, the gain region 201 is defined by the proton implanted region 202 while the optical mode is defined by the dielectric aperture 203 in the top mirror 4. The dielectric aperture is preferably formed by oxidation of a layer with high aluminium content. Thus, a layer with high aluminium content should be provided to the position where the dielectric aperture is to be formed when the mirror 4 is prepared.

Figure 3:
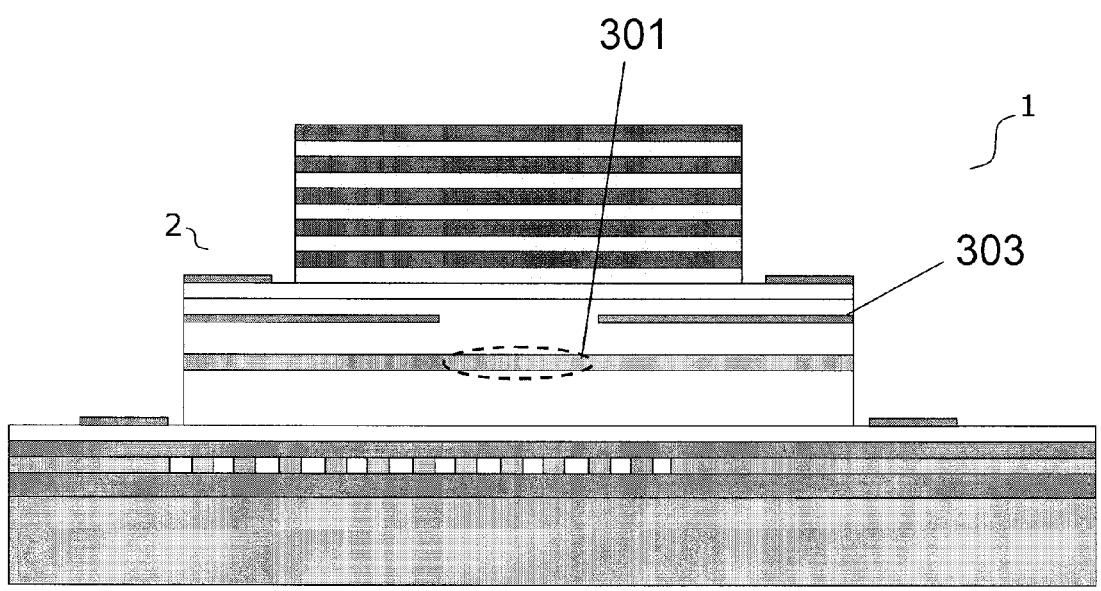

In the embodiment of the hybrid VCL shown in FIG. 3, both optical gain region 301 and optical mode are defined by the dielectric aperture 303, preferably an oxide aperture formed in the active region. For the formation of dielectric aperture 303, it is preferred that one of layers between the upper contact 8a and the QW region 6 should have a high aluminium content for oxidation. The top mirror is an undoped DBR which can be expitaxially grown with the active region, wafer-bonded to the active region, or deposited on top of the active region.

Figure 4:
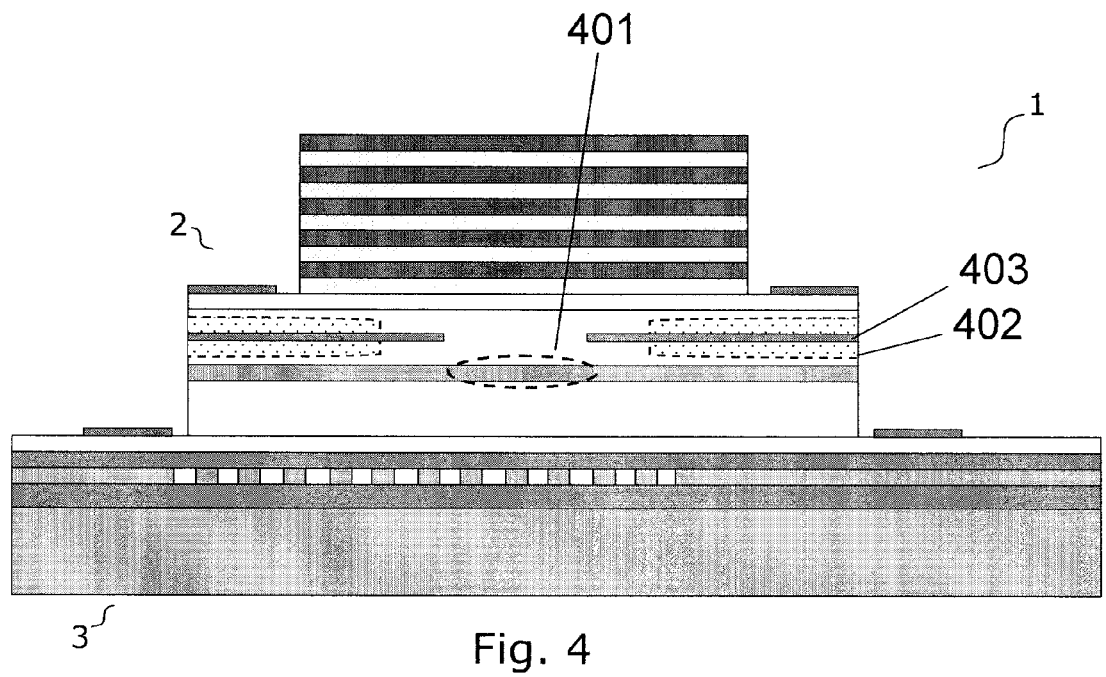

In the embodiment of the hybrid VCL shown in FIG. 4, both optical gain region 401 and optical mode are defined by the dielectric aperture 403. The proton implanted region 402 is advantageous for high speed operation.

Figure 5:
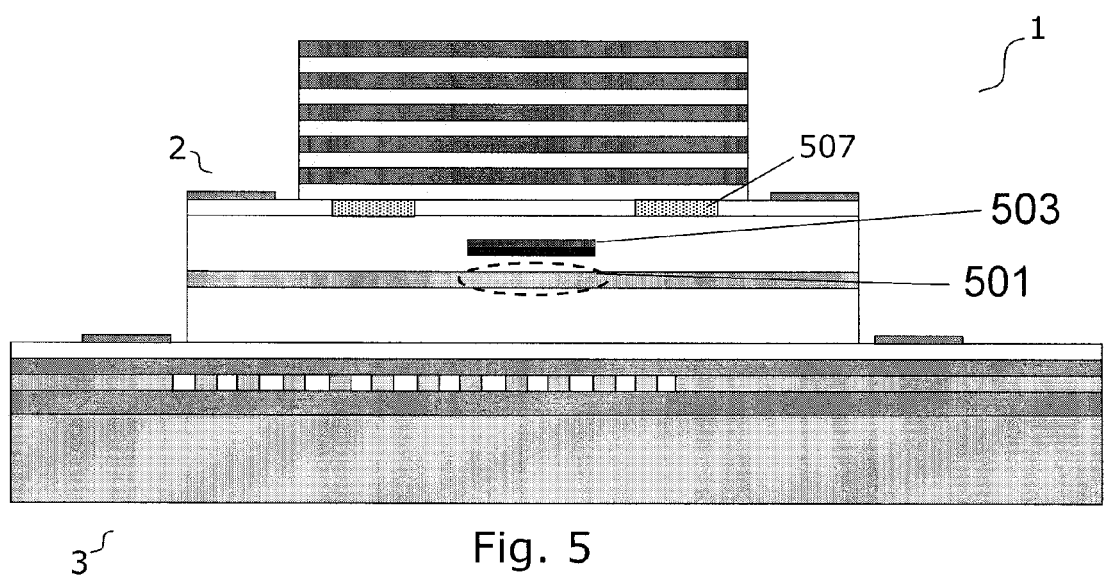

In the embodiment of the hybrid VCL shown in FIG. 5, the optical gain region 501 is defined by the tunnel junction 503 while the optical mode being defined by tunnel junction 503 and the thermal lensing effect. In a tunnel junction, highly n-doped and p-doped thin layers are put together, and the current flows only through this junction. Optionally, the embodiment can have intra-cavity air gaps 507 for further tuning of the optical confinement.

Figure 6:
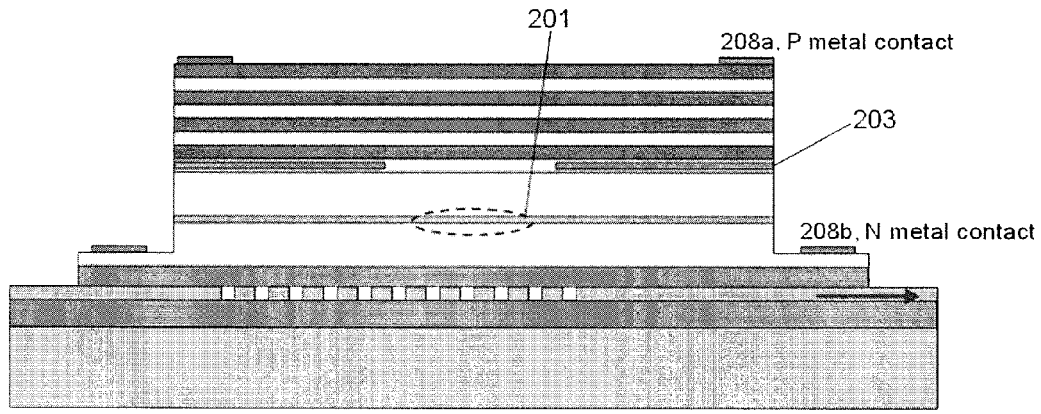

In the embodiment of the hybrid VCL shown in FIG. 6, the top mirror is p-doped DBR which is preferably expitaxially grown with the active region. An oxide aperture (203) is formed by oxidizing a high aluminium content layer for both optical and gain confinements. This structure can be realized with GaAs latticed matched materials.

Figure 7A:
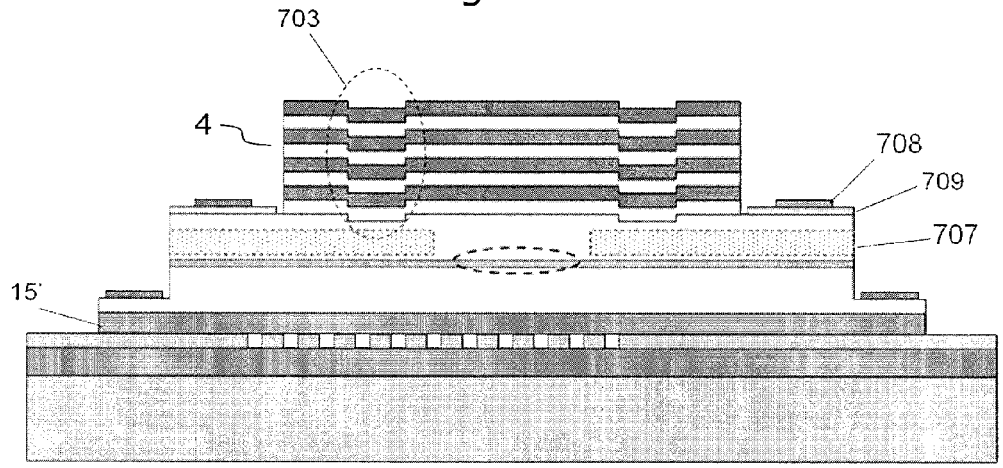

In the embodiment of the hybrid VCL shown in FIGS. 7A and B, the optical confinement is provided by vertically-shifted parts 703 of the DBR and the gain confinement by proton implanted region 707. The top DBR 4 is deposited after making shallow intra-cavity air gaps to form the vertically-shifted parts 703. This structure can be realized with InP or GaAs lattice matched materials. In the case of InP lattice-matched materials, the P contact layer 709 is preferably highly absorbing InGaAs. To avoid unwanted absorption, the central of the P contact layer 709 is preferably removed. In the case of GaAs lattice-matched materials, this removal is not required. FIG. 7A shows the hybrid VCL with a low index oxide layer 15', and 7B with a low index air gap 15" formed using an oxide spacer layer or mesa 715.

Silicon Platform Substrate and Grating Region

The silicon platform substrate 3 is preferably a silicon-on-insulator (SOI) substrate consisting of a silicon substrate with a supporting layer 9 (typically SiO$_2$) topped by a silicon layer 10. Other configurations are possible, but it is preferred that the silicon layer is supported by a layer with lower refractive index as is the case here. The silicon platform substrate 3 is shown alone in a top-view in FIG. 1B-D.

In a preferred embodiment, the SOI substrate also holds integrated photonic and electric circuitry. Preferably, the photonic circuitry including grating region 11 is formed using matured and precise silicon processing technologies such as complementary metal-oxide-semiconductor (CMOS) processing techniques, at the same time the electrical circuitry is formed using the same technologies.

In the top silicon layer 10 is formed a grating region 11 and a waveguide 18 or 19. The grating region 11 comprising a 1D or 2D periodic refractive index grating 12 formed by silicon layer parts 13 and regions 14 formed in the silicon layer which have a refractive index lower than the refractive index of the silicon layer. The regions 14 may be formed by removing the silicon layer in those regions, e.g. by matured silicon processing techniques, to form holes. The holes can be left empty, or could potentially be filled with a low-index material if this can be done without destroying the silicon parts 13. In an alternative approach, the regions 14 are formed by other modification of these regions of the silicon layer. The patterning and periodicity of the parts 13 and regions 14 of the periodic refractive index grating 12 will be described in more detail later in relation to FIGS. 13 and 14.

Low Index Layer

As mentioned previously, it is preferred that the silicon layer 10 is supported by a layer with lower refractive index, in this case the SiO$_2$ layer 9. Similarly, it is preferred that the layer above the silicon layer 10 also has a lower refractive index. It is preferred to sandwich the grating region 11 between layers of lower refractive indices for gaining a high reflectivity from the grating region 11.

Figure 9A:
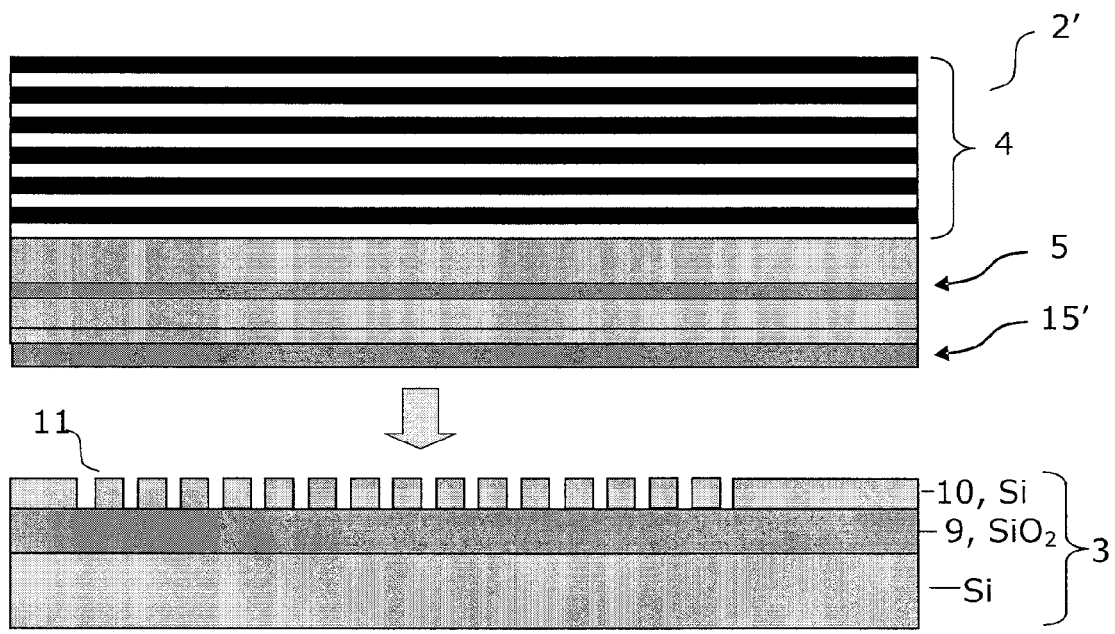
FIGS. 9-12 schematically illustrate different assembly and fabrication schemes according to embodiments of the invention.
Figure 9B:
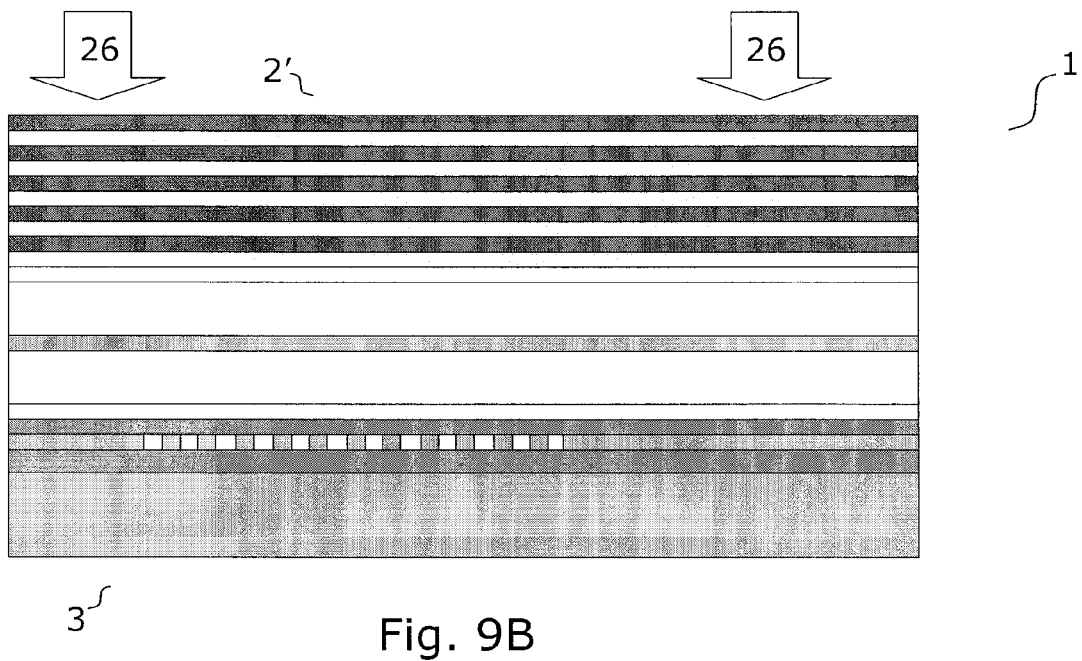
Figure 9C:
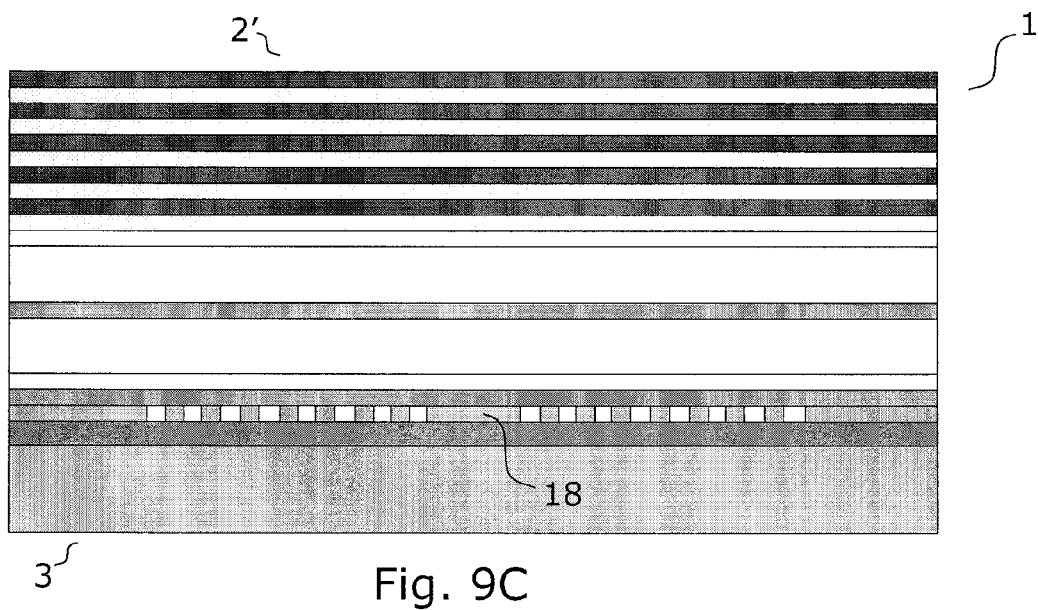
Figure 9D:
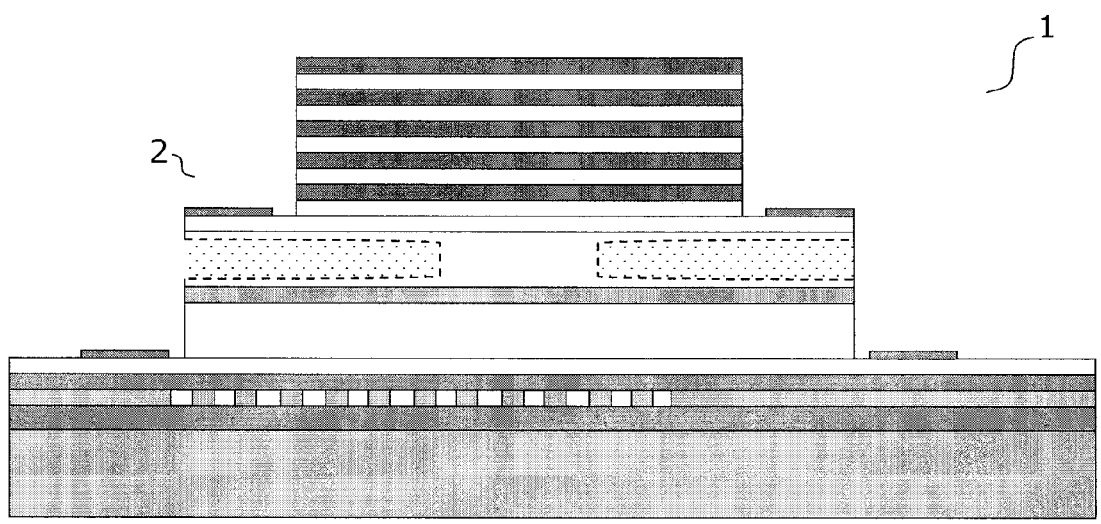
Figure 10A:
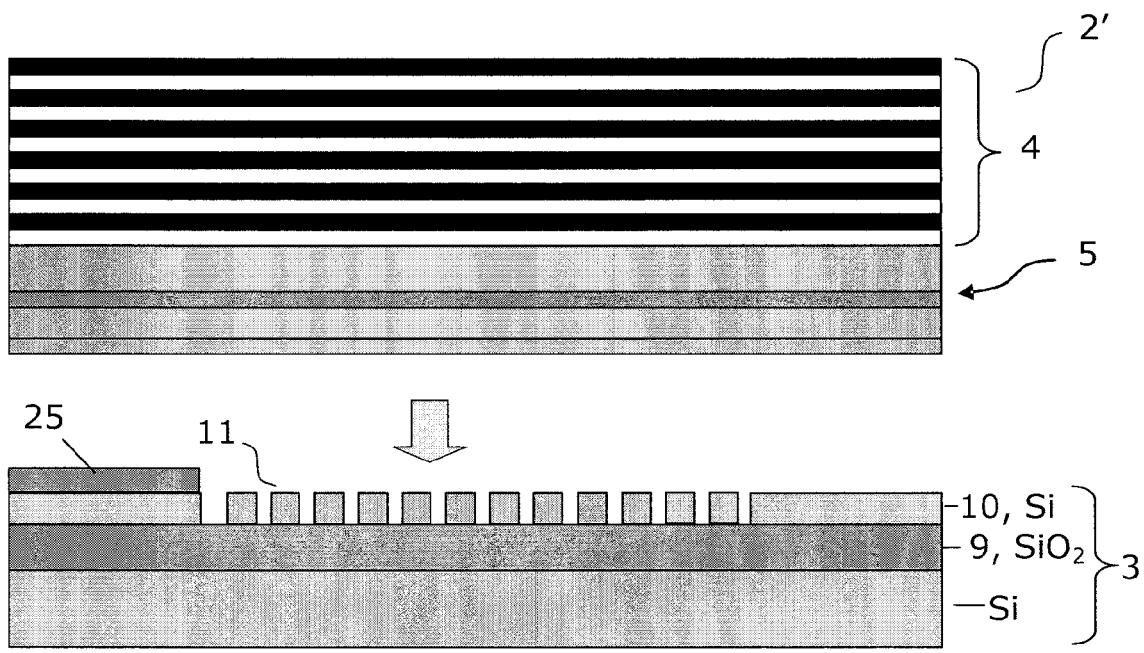
Figure 10B:
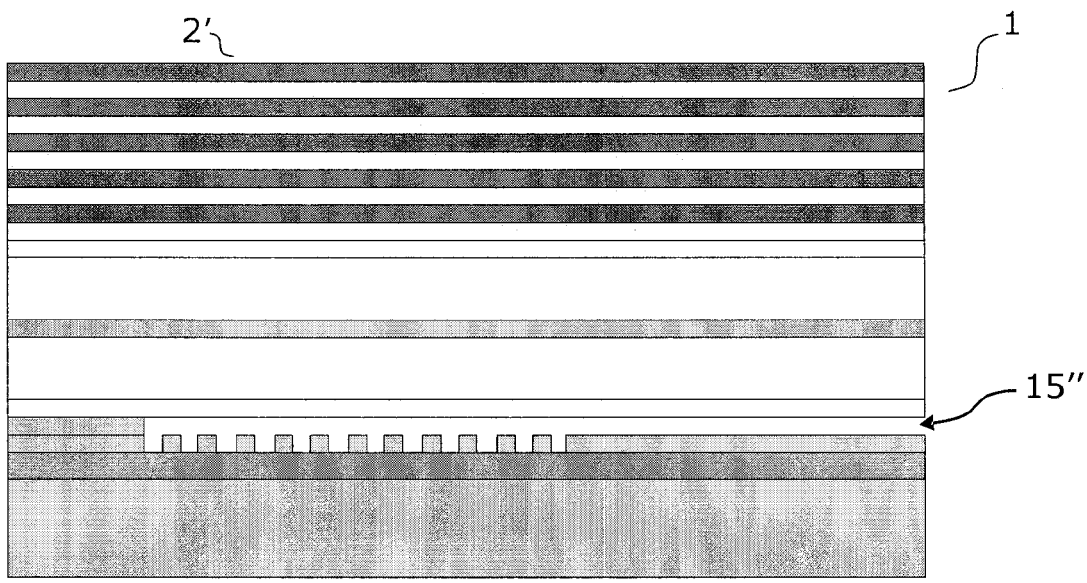
Figure 10C:
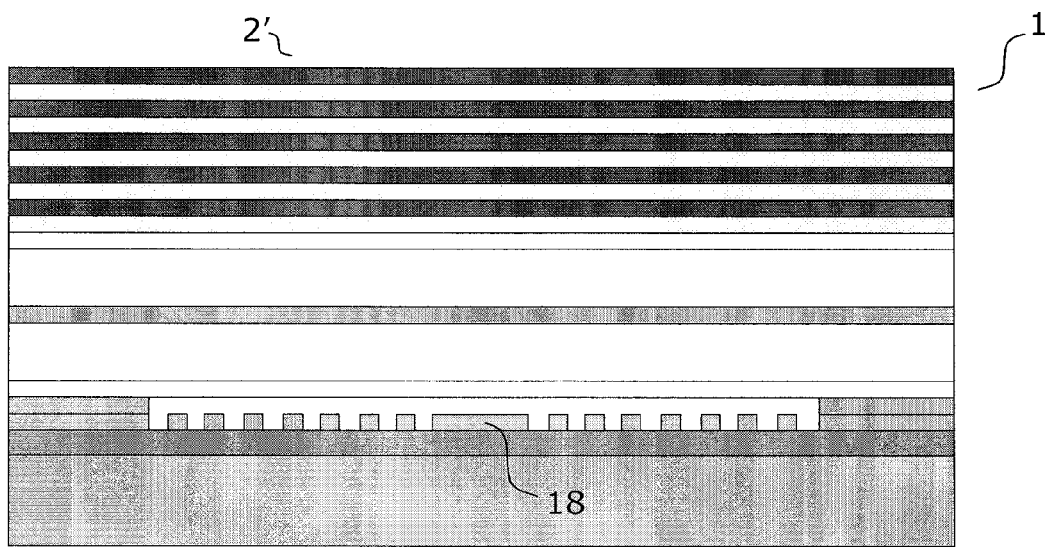
Figure 10D:
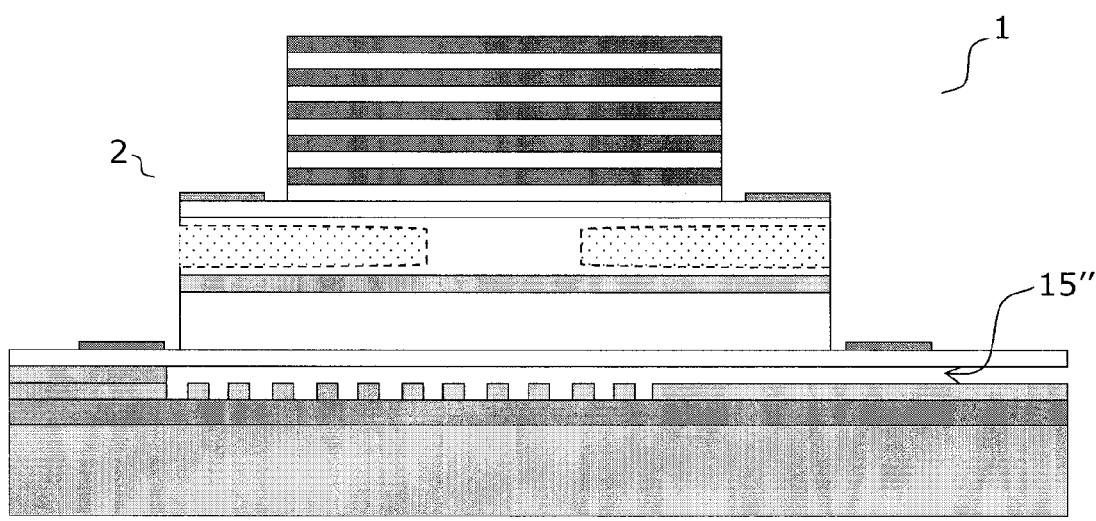

For this purpose, a gap 15 between the silicon layer 10 and the partial VCL structure 2 is filled by material having a lower refractive index than silicon. In the embodiment shown in FIG. 1A and FIG. 9D, such low index gap is provided by an oxide layer 15'. The oxide layer 15' is preferably provided on the partial VCL structure 2 prior to assembly, as shown in FIG. 9A. FIGS. 9B and 9C show the front and right cross-sectional profile of bonded wafers, respectively. In the embodiment shown in FIG. 10D, the GMVCL involves a structuring that forms an air gap 15" above the grating region 11. Here, the structuring can be mesas 25 surrounding the grating region. As shown in FIG. 10A, the mesa 25 is preferably provided on the silicon layer 10 prior to assembly in order to avoid aligning during the wafer bonding. FIGS. 10B and 10C show the front and right cross-sectional profile of bonded wafer, respectively. In order to avoid evanescent coupling, the thickness of oxide layer 15' or air gap 15" preferably has a minimum thickness of $\lambda/2n_{gap}$, where $\lambda$ is the lasing wavelength of interest and $n_{gap}$ is the refractive index of oxide layer 15' or air gap 15". For typical applications with $\lambda$=1550 nm, this minimum thickness is about 500 nm for the oxide layer 15' and about 780 nm for the air gap 15".

By varying the thickness of oxide layer 15' or air gap 15", the effective cavity length $d_{eff}$ of the VCL cavity can be changed. This leads to the change of lasing wavelength $\lambda$ that is determined by the following relation:

$$\phi_{top} + \frac{2\pi n_{eff} d_{eff}}{\lambda} + \phi_{grat} = 2\pi N, \quad N = \text{integer}$$

Here, $\phi_{top}$ and $\phi_{grat}$ are reflection phase shift from the top mirror and the bottom grating mirror. The $n_{eff}$ is effective refractive index of the VCL cavity. Thus, the lasing wavelength $\lambda$ can be feasibly chosen during processing, which makes the hybrid VCL adequate for multi-wavelength source.

Grating Mirror and Waveguide

The periodic refractive index grating 12 surrounded by lower index layers 9 and 15 establishes a high index contrast grating-mirror which functions as a bottom mirror for the hybrid VCL, and a VCL cavity is thereby formed between the periodic refractive index grating 12 and the top mirror 4.

The regions 14 are preferably larger than the lateral extension of the vertically-resonant mode 16 to provide high reflectivity. The thickness of the periodic refractive index grating 12 can be that of the silicon layer 10, but may also be made smaller by selective etching of the grating region 11. The preferred values of key designing parameters of the grating mirror such as thickness, periodicity, and air filling ratio are described later.

The supporting layer 9, here SiO$_2$, serves to vertically confine light to the grating region 11 and therefore preferably has a lower refractive index. To avoid undesirable evanescent coupling to silicon substrate, the supporting layer preferably has a minimum thickness of $\lambda/2n_{supp}$, where $n_{supp}$ is the refractive index of the supporting layer. For typical applications at $\lambda$=1550 nm and with the supporting layer being SiO$_2$, this minimum thickness will be around 500 nm.

The origin of the high reflection of the bottom grating mirror is explained in terms of the modes involved. The involved modes are schematically drawn in FIGS. 1A and 1B. First, the VCL cavity supports a vertically resonant mode symbolised by arrow-loop 16. Arrow 17 symbolises a laterally-propagating slow light mode of the grating. This slow light mode is an Eigen mode of the periodic refractive index grating 12. The light in the mode 16 is diffracted when incident to the grating; the part of diffracted light is coupled to the mode 17; the light in the mode 17 is coupled back to the mode 16. This coupling process may bring resonance, leading to a high reflectivity. The number of modes 17 involved in the coupling can be one or plural, depending on the design. No coupling loss is expected provided that the whole grating region is exactly periodic.

The hybridised structure as described above serves the function of efficiently providing light in in-plane modes on a silicon platform. Below coupling the light in the slow light mode 17 to the laterally oriented out-coupling waveguide, and further to photonic circuitry or similar in the silicon platform, is described.

In a preferred embodiment illustrated in FIG. 1, light is coupled to an index contrast waveguide (ICWG) 19 formed in the silicon layer 10 to be connected to the grating region 11, preferably through an intermediate grating waveguide (GWG) 18 formed within the grating region 11 as shown in FIG. 1B. In the alternative, the light is coupled directly to an ICWG 19 formed to be connected to the grating region as illustrated in FIG. 1C. In another alternative light is coupled only to a GWG 18 formed within the grating region 11 as illustrated in FIG. 1D.

The GWG 18 can be constituted by a line defect in the periodic refractive index grating 12 of the grating region 11 and supports a laterally-propagating GWG mode 20 as shown in FIGS. 1A and 1B. The GWG 18 should be arranged to have some overlap with the lateral extension of the vertically-resonant mode 16 determined by the active region 101 as illustrated by the circle 16a in FIG. 1B. Then, a part of light can be extracted from the PBG mode 17 to the GWG mode 20. The shape of GWG 18 can be optimized for efficient extraction. This issue will be described further later in relation to FIG. 16.

The ICWG 19 is preferably a ridge waveguide formed outside the grating region by removing parts of the silicon layer by photolithography and etching. The ICWG 19 supports laterally-propagating ICWG mode 21 and is arranged to abut grating region at the end of the GWG 18. Then, the GWG mode 20 from the GWG 18 converts to ICWG mode 21. The ICWG 19 can connect to and form part of photonic circuitry on the silicon platform. The connecting part between the GWG 18 and the ICWG 19 can be can be optimized for better conversion efficiency. This issue will be described further in relation to FIG. 16.

Building Blocks

Figure 8:
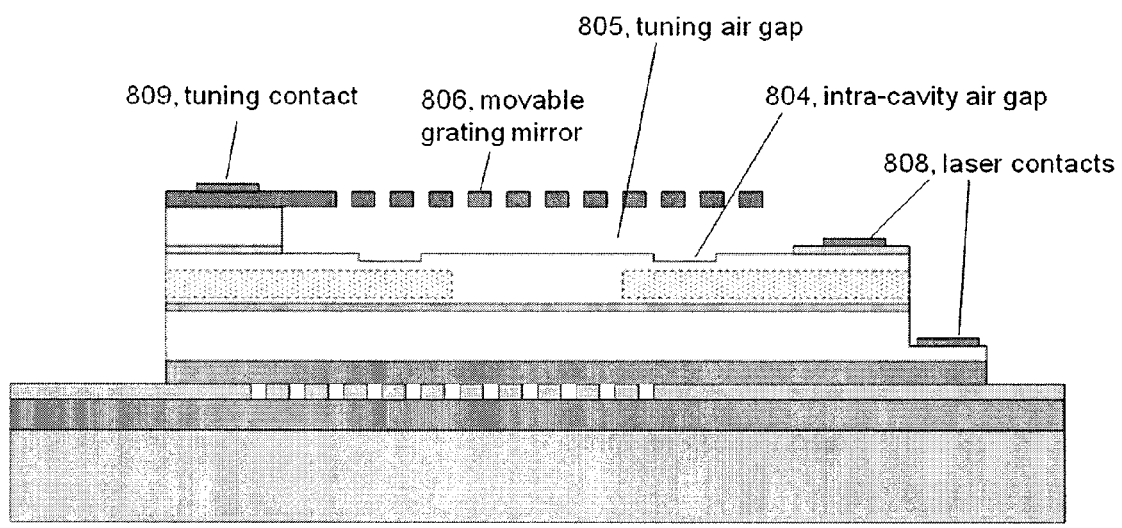
FIG. 8 shows a tunable hybrid VCL according to an embodiment of the invention.
Figure 11A:
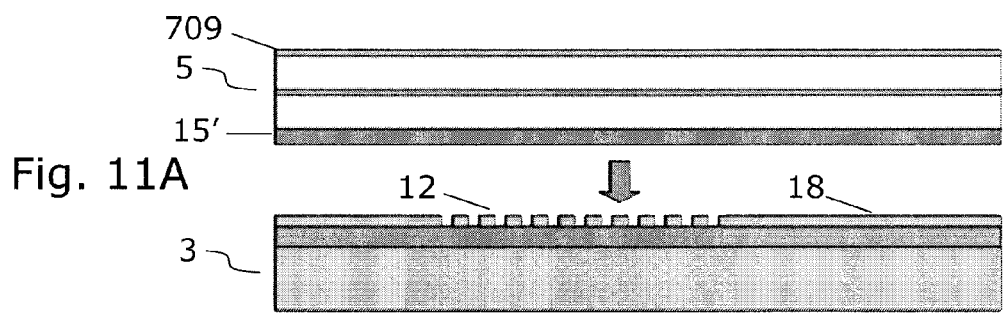

In summary, the building blocks of the hybrid VCL 1 can in preferred embodiments comprise:
a top part being a partial VCL structure 2 with
A top mirror 4. The top mirror can be a multi layer mirror so called distributed Bragg mirror (DBR), or a single layer grating mirror. They can be epitaxially grown on top of the active region, wafer-bonded to the active region, or deposited on top of the active region.
An active region 5. The active region can be InP or GaAs lattice matched materials. Other III-V semiconductors can be employed depending on the purpose of applications.
Means for optical confinement. Optical confinement can be obtained in various ways such as vertically shifted DBR, oxide aperture, and thermal lensing as described in relation to FIGS. 1-7.
Means for gain confinement. Gain confinement can be obtained in several ways such as proton implantation, oxide aperture, and tunnel junction as described in relation to FIGS. 1-7.
A low index gap 15. The low index gap can be oxide (or other low index material) or air.
When the gap is an oxide layer 15', it is preferable that the oxide gap is deposited to the active before bonding, as illustrated in FIG. 11A. In the case of air gap 15", it is preferable that a spacer layer is deposited to the SOI before making the grating pattern, as illustrated in FIG. 11A.

a silicon platform substrate 3, such as a SOI substrate, with
a grating region 11 forming
a silicon-based grating mirror 12, and
a laterally out-coupling grating waveguide 18,
Metal contacts. The metal contacts can be P and N contacts or N and N contacts, depending on the gain confinement apparatus. For example, when the implantation or oxide aperture is employed for the gain confinement, P and N contacts should be used. In the case of tunnel junction, N and N contacts should be used. Depending on designs, the top contact can be formed on top of the top mirror (extra-cavity contact scheme) or on top of the active (intra-cavity contact). In tunable lasers, an extra tuning contact is required, as illustrated in FIG. 8. Optionally, the metal contacts are formed on highly doped contact layers. When the active consists of InP-lattice matched material and the P metal contact is required, the P contact layer is preferably highly absorbing InGaAs. Thus, part of this layer (107) needs to be removed to avoid unwanted absorption, as illustrated in FIGS. 7A and B and 11D.

The various embodiments illustrate different ways in which these building blocks can be combined. However, the described designs are not limited to these embodiments, but any other combinations are possible as long as they can be hybridised with a silicon-based grating mirror with a laterally oriented waveguide for out-coupling purposes.

In the embodiment shown in FIG. 8, the hybrid VCL is a tunable hybrid laser. The top grating mirror (806) can be movable by using electrostatic force (described in more detail in Optics Express 15, 1222 (2007)), piezoelectric force (described in more detail in IEEE J. Selected Topics in Quant. Electron. 13, 374 (2007)), or thermally-induced strain (described in more detail in IEEE Photon. Technol. Lett. 18, 688 (2006)) by applying voltage or current through a tuning contact 809. The movable top grating mirror can be replaced with a DBR or a mixture of grating and DBR. As the thickness of the tuning air gap changes, the emission wavelength of laser also can be varied.

Fabrication

In the following, different embodiments of fabricating the hybridised VCLs according to some of the embodiments presented earlier will be described. First, a typical fabrication of the hybridised VCL structure 1 is described in relation to FIG. 2.

As the partial VCL structure 2 is based on matured VCSEL technology, the fabrication of the partial VCL structure 2 as described in the above is considered within the realms of the person skilled in the art of VCSEL fabrication. Similarly, the fabrication of the grating region 11 in the silicon platform substrate 3 is based on matured, precise, and cheap standard silicon processing technologies, which will typically be done simultaneously with the fabrication of electrical circuitry on the same silicon platform substrate 3.

The partial VCL structure 2 is arranged on the silicon platform substrate 3 so that there is an overlap between transversal optical mode confinement in the GMVCL (defined by vertically-shifted DBR region 703, by the dielectric aperture, by the thermal lensing effect, or by the lateral extension of the top mirror 4) and the grating region 11.

In most of embodiments of hybrid VCL structure, arranging the partial VCL epi structure 2' in FIG. 9A onto the silicon platform substrate 3 does not involve any significant aligning effort. No need of aligning for wafer bonding enables the mass production of hybrid VCL at a low fabrication cost. This feature is described in detail with embodiments of hybrid VCL structure shown in FIGS. 1-7.

In the embodiment of hybrid VCL structure shown in FIG. 1A, the proton implantation is performed during the typical processing of hybrid VCL after the wafer bonding, as described in FIG. 9. The position of proton implanted region 202 can be defined to be in alignment with both the grating region 11 and the GWG 18. Thus, no aligning effort is necessary for the wafer bonding.

In the embodiment of hybrid VCL structure shown in FIG. 2, the proton implantation and oxidation is performed during the typical processing of hybridised VCL after the wafer bonding. The positions of proton implanted region 202 and dielectric aperture 203 can be defined to be in alignment with both the grating region 11 and GWG 18. Thus, no aligning effort is required for the wafer bonding.

In the embodiment of hybrid VCL structure shown in FIG. 3, the dielectric aperture is formed using oxidation during the typical processing of hybridised GMVCL after the wafer bonding. The position of dielectric aperture 303 can be defined to be in alignment with both the grating region 11 and the GWG 1. Thus, no aligning effort is required for the wafer bonding.

In the embodiment of hybrid VCL structure shown in FIG. 4, the proton implantation and the oxidation for the dielectric aperture 403 is performed during the typical processing of hybridised VCL after the wafer bonding. The positions of proton implanted region 402 and the dielectric aperture 403 can be defined to be in alignment with both the grating region 11 and GWG 18. Thus, no aligning effort is required for the wafer bonding.

In the embodiment of hybrid VCL structure shown in FIG. 5, the tunnel junction 503 is formed by re-growth technique during epitaxial growth of the partial VCL epi structure 2'. Aligning the tunnel junction 503 with the grating region 11 and GWG 18 is necessary when bonding the partial VCL epi structure 2' and silicon platform substrate 3.

The following describes the fabrication of the hybrid VCLs described in relation to FIGS. 7A and B. The fabrication methods described here can be applied, or modified to be applicable to, the other embodiments described in relation to FIGS. 1-8 by the person skilled in the art.

Figure 11B:
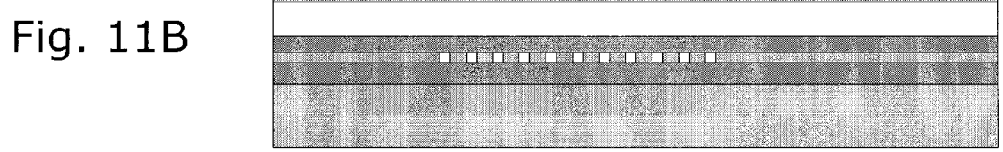
Figure 11C:
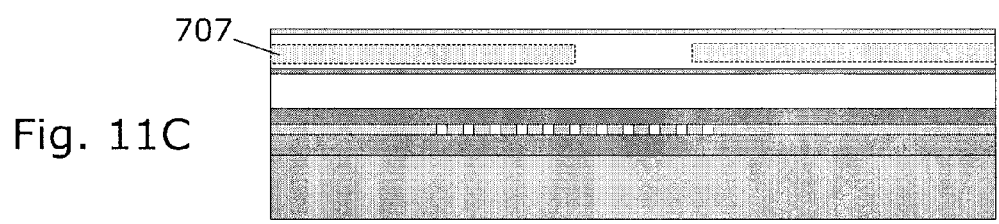
Figure 11D:
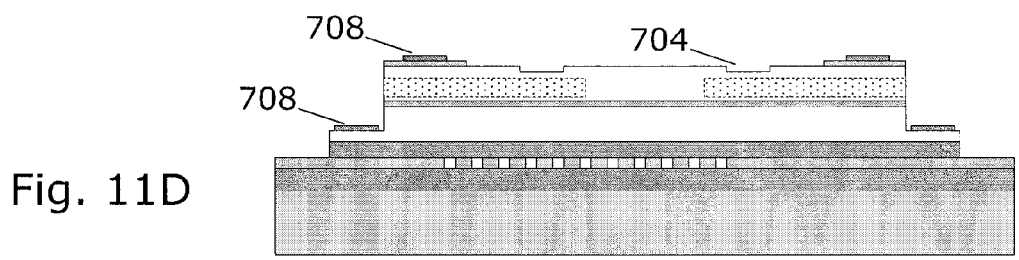
Figure 11E:
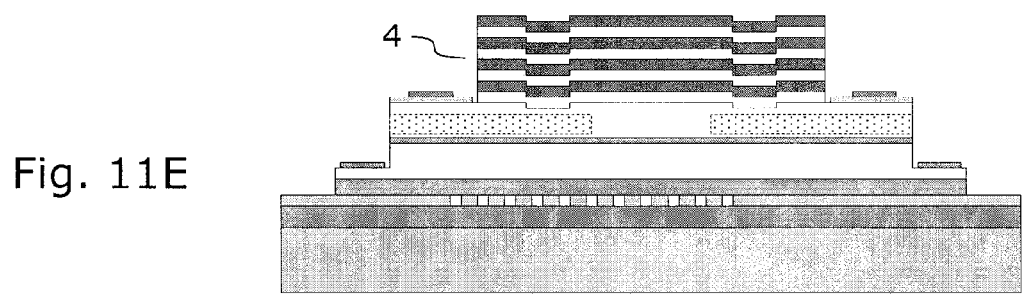

A fabrication flow for the hybrid VCL of FIG. 7A is illustrated in FIGS. 11A-E. As illustrated in FIG. 11A, the active region 5 with an oxide gap 15' deposited and the silicon-based grating mirror 12 with a waveguide 18, are separately prepared. Then, they are wafer-bonded, as shown in FIG. 11B. For gain confinement, proton implanted regions 707 are formed as shown in FIG. 11C. Then, mesas are defined, the central part of the highly absorbing P contact layer 709 is removed, shallow trenches 704 for the formation of vertically-shifted DBR are etched, and metal contacts 708 are formed, as shown in FIG. 11D. Then, a top DBR is deposited, as shown in FIG. 11E. No alignment is required in wafer bonding level. All other aligning precision is determined by photolithography resolution that is sufficient for most of applications.

Figure 7B:
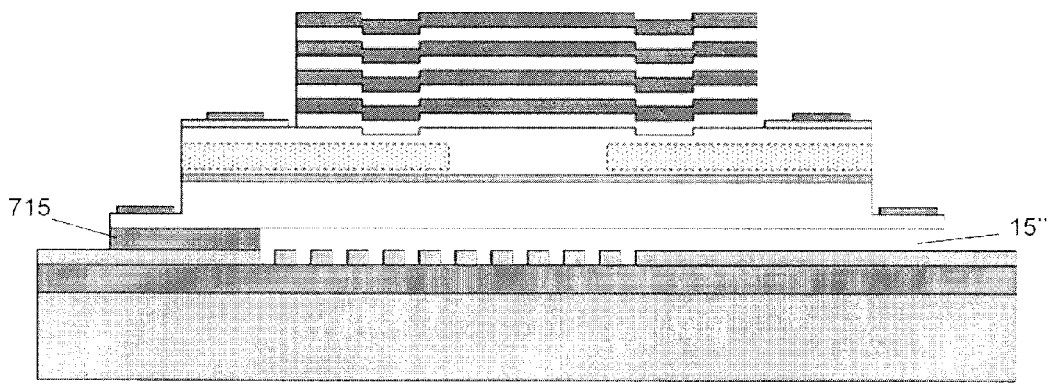
Figure 12A:
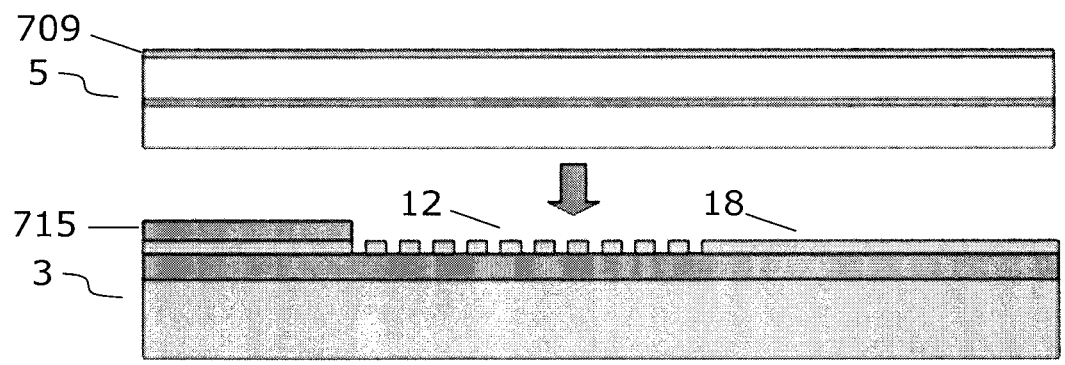
Figure 12B:
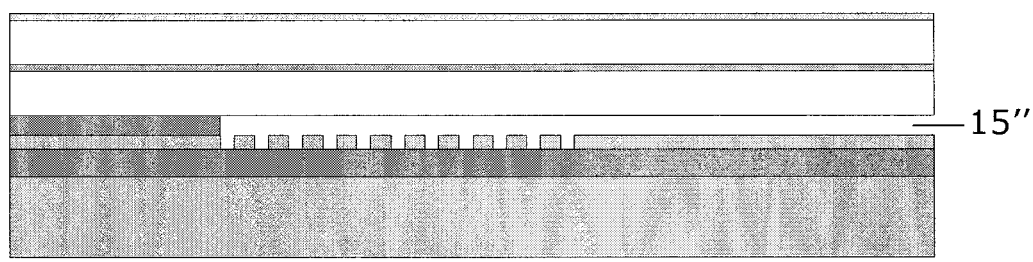

FIGS. 12A and B show part of a fabrication flow for the hybrid VCL of FIG. 7B. The flow is similar to the one described in FIG. 11A-E, except that no low index oxide layer is deposited on the active region 5, but instead a mesa 715 is formed on the substrate 3 to produce low index air gap 15" (12B).

The Grating Region—Properties and Simulation

Figure 13:
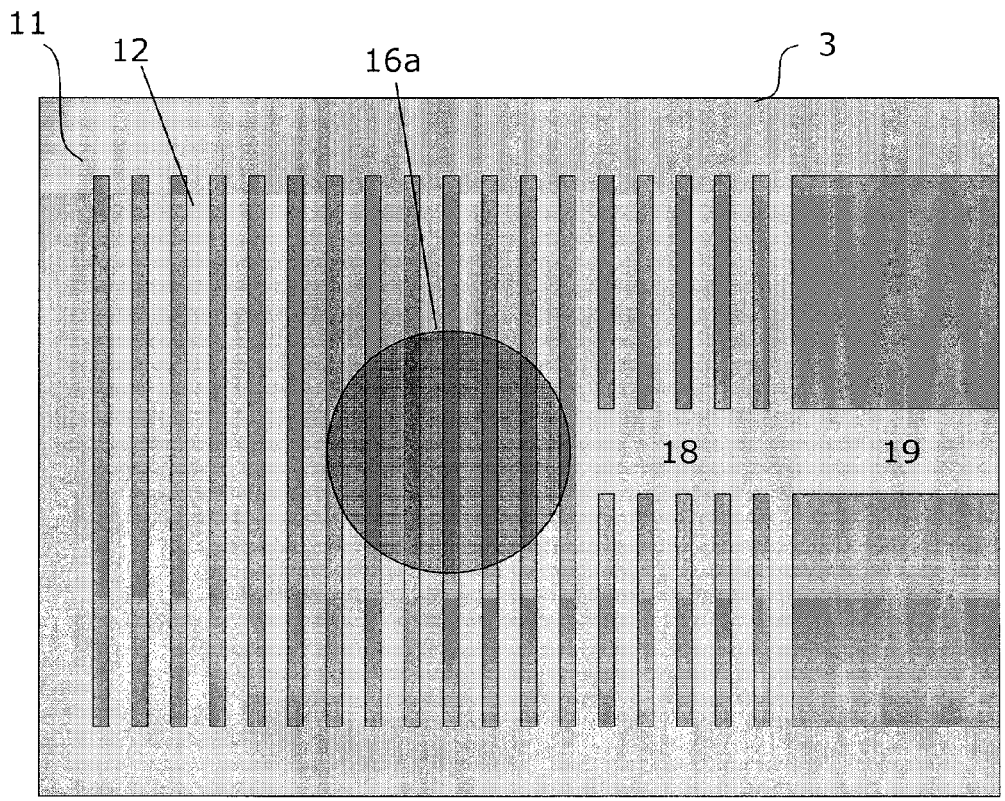
FIGS. 13 and 14 show different layouts of grating regions in accordance with embodiments of the invention.
Figure 14:
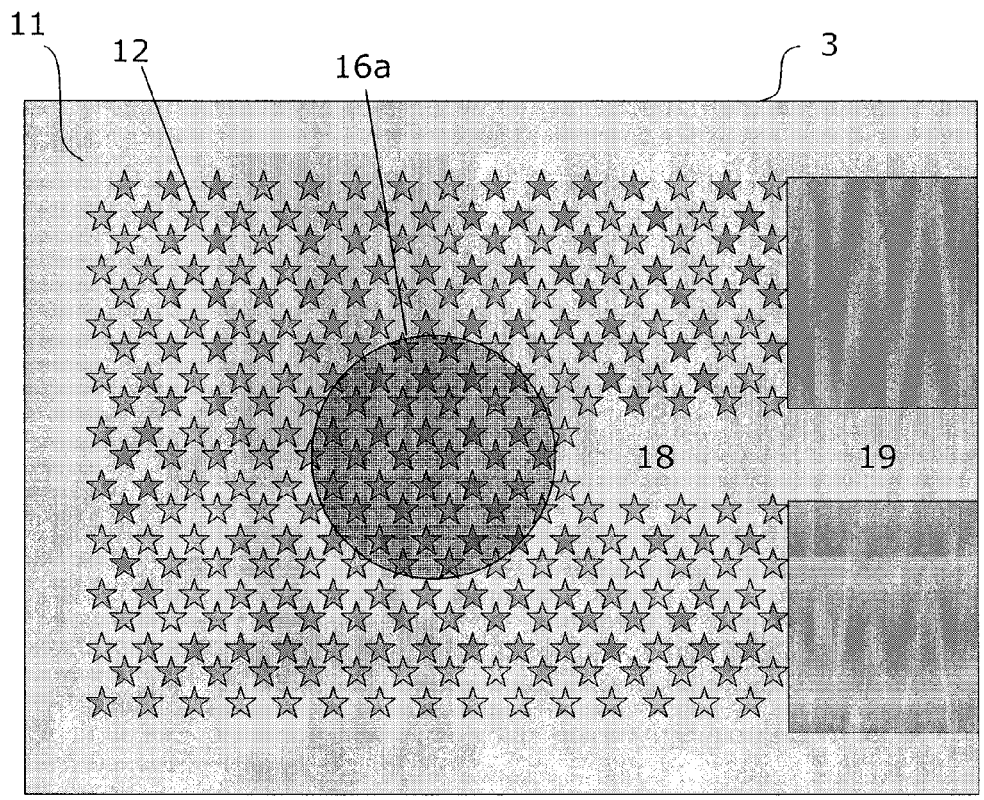

Different 1D, 2D, and modified 2D patterns of the periodic refractive index grating 12 of the grating region 11 are shown in FIGS. 1B, 13 and 14. In all three cases, the pattern should be periodic to have Eigen modes. As shown in FIG. 14, the shape of a single pattern might be made looking odd if necessary.

From ideal design point of view, the important thing is which pattern gives desirable PBG mode dispersion and the resultant mirror characteristics. From fabrication point of view, the mechanical stability of thin grating layer structure, the fabrication feasibility, and fabrication cost need to be considered to choose the pattern.

The periodicity, thickness, refractive index, and air filling ratio of grating mirror determines the dispersion of PBG modes of the grating mirror layer. In the following, possible ranges of the aforementioned design parameters of grating mirror are listed. Any other value can be also used if it leads to desirable Eigen mode dispersion.

The periodicity of grating pattern, either 1D or 2D, ranges from $0.4\lambda$ to $0.8\lambda$ where $\lambda$ is the lasing wavelength of interest.

The optical thickness of a grating layer can ranges from $0.6\lambda$ to $1.6\lambda$. The optical thickness of a layer is defined as the physical thickness of the layer multiplied by the refractive index of the layer.

The air filling ratio ranges from 20% to 70%. The air filling ratio is defined as a fraction of air (or other low index material) area 14 among the area of one grating period (13+14).

Figure 15:
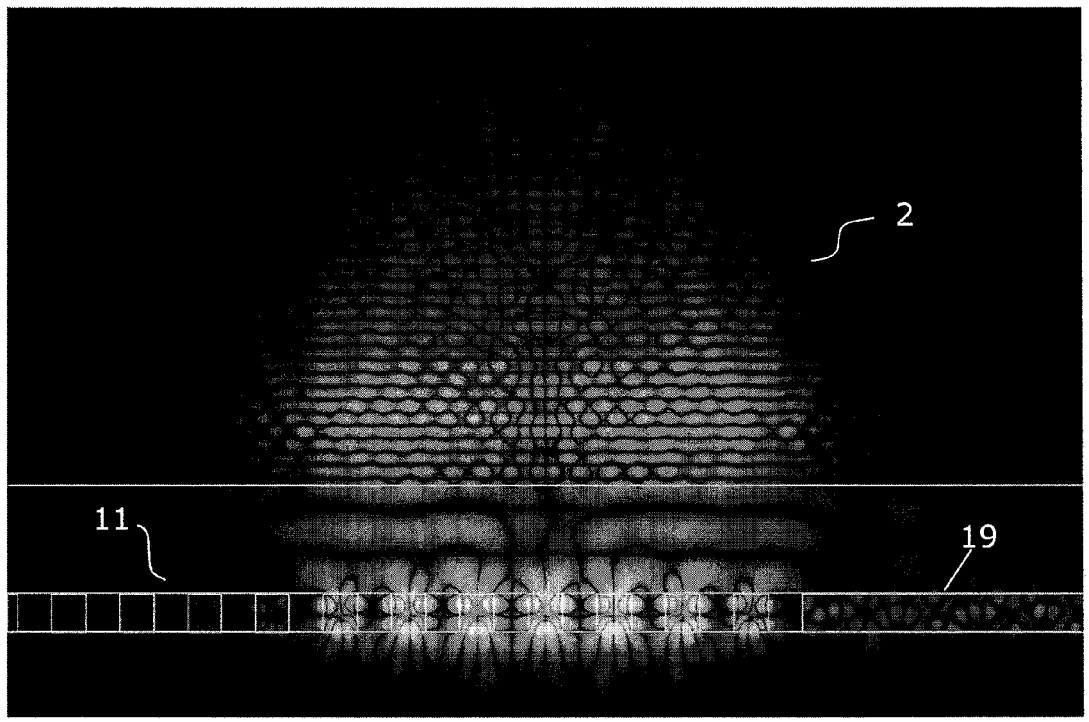
FIG. 15 is a frame from a dynamic (time-domain) numerical simulation of an embodiment of the invention.

A numerical simulation of the function of an embodiment of the present invention was performed. FIG. 15 shows a time frame from this dynamic simulation, where white and black indicate high and low electromagnetic (EM) field intensities, respectively. The design of the simulated device was similar to that shown in FIG. 3, and FIG. 15 also indicates approximate positions of the partial VCL structure 2, the grating region 11 and the ICWG 19 in the silicon layer.

As can be seen, there is a reasonable coupling from the vertical lasing modes (16 in FIG. 1A) to the ICWG modes (21 in FIG. 1A).

Figure 16A:
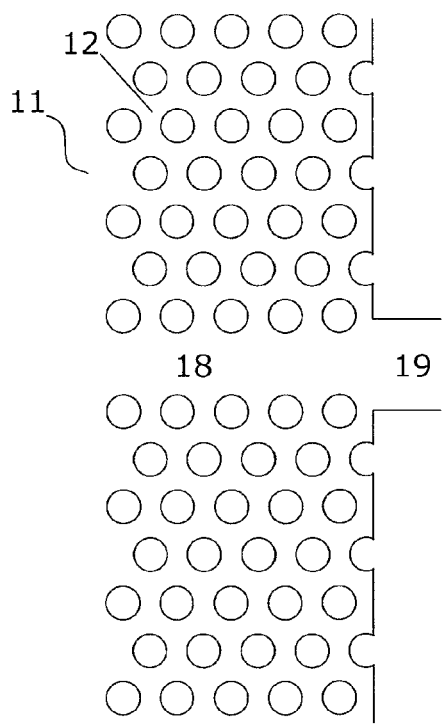
FIGS. 16A and B show examples of optimization of areas designated in FIG. 1B.
Figure 16B:
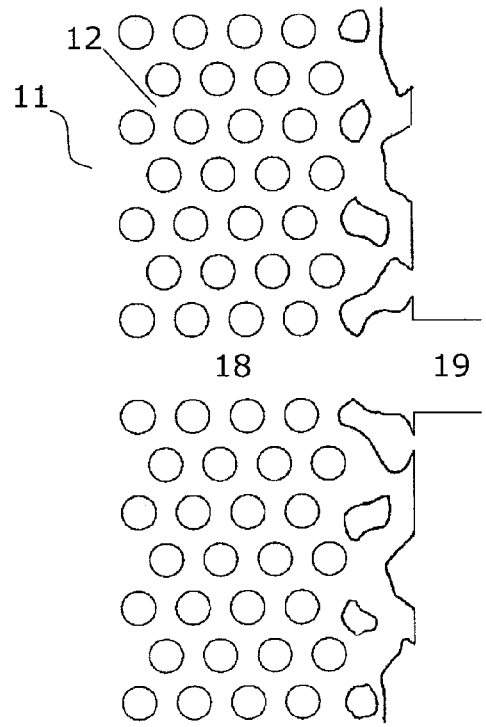

As mentioned previously, the extraction of light from the PBG mode 17 in periodic grating region 12 to GWG mode 20 in GWG 18 can be further optimized to reduce undesirable coupling loss. The connecting part 28 in FIG. 1B can be topologically optimized to minimize the scattering loss due to the breaking of periodicity of grating. The shape of GWG 18 can be optimized so that the dispersion of GWG mode 20 should be similar as that of PBG mode 17 for better mode matching. The efficiency of mode conversion from GWG mode 20 in GWG 18 to ICWG mode 21 in ICWG 19 also can be maximized by topologically optimizing the connecting part 30 in FIG. 1B or C. A schematic example of topological optimization is shown in FIG. 16. FIGS. 16A and 16B shows the connecting part 30 before and after the optimization, respectively.

Examples of such topology optimization is described in e.g. L. Yang, et al., Electronic Letters, 13, p. 923 (2007), where 5 dB improvement in transmission is reported.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

REFERENCES

Gunn, Photonics Spectra March 2006, pp. 62-67
Fang et al. Optics Express, 14, pp. 9203 (2006)
US 2007/0153860
US 2000/6031243
I.-S. Chung et al., IEEE Photonic. Tech. Lett. 20, 1041 (2008)
US 2007/0201526
R. Jones et al., "Grating based hybrid silicon lasers", Proceedings of SPIE, vol. 7230, pp 72300U-1 to 72300U-8.
WO 2005/089098
H. Wu et al., "Ultra broadband SOI binary blazed grating mirror", 5th IEEE International Conference on Group IV Photonics, pp 299-301.
Huang et al., Optics Express 15, 1222 (2007)
IEEE j. selected topics in Quant. Electron. 13, 374 (2007)
IEEE Photon. Technol. Lett. 18, 688 (2006)
L. Yang, et al., Electronic Letters, 13, p. 923 (2007)

The invention claimed is:

1. A method for hybridizing a vertical-cavity laser (VCL) structure on a silicon platform using a bottom grating-mirror in the silicon platform, the method comprising:
   providing a layered structure comprising an active region formed in III-V materials and a highly reflective top mirror that is not used as an out-coupling mirror and that has a reflectivity larger than 99.5%;
   forming a grating region in a silicon layer supported by a supporting layer with lower refractive index, the grating region comprising a one-dimensional (1D) or two-dimensional (2D) periodic refractive index grating formed by silicon layer parts and regions being formed in the silicon layer and having refractive indices lower than the refractive index of the silicon layer;
   forming a waveguide in the silicon layer of the grating region with an end face formed within or abutting the grating region to facilitate lateral out-coupling of light from the grating region to the waveguide; and
   arranging the layered structure on the grating region, comprising providing a layer with refractive index lower than the refractive index of the silicon layer between the layered structure and the grating region, whereby the periodic refractive index grating establishes a bottom grating-mirror to form a VCL cavity between the top mirror and the grating region, and wherein the bottom grating-mirror has a reflectivity greater than 99%, wherein the supporting layer has a refractive index $n_{supp}$ and a thickness of at least $\lambda/2n_{supp}$ to vertically confine light to the grating region and to avoid undesirable evanescent coupling to lower layers.

2. A method according to claim 1, further comprising initiating lasing in the VCL and coupling of light from the VCL cavity to lateral modes of the grating region.

3. A method according to claim 2, wherein the end part of the waveguide formed in the silicon layer comprises a grating waveguide (GWG) formed within the grating region, the method further comprising coupling of light from the lateral modes of the grating region to guided modes of the GWG.

4. A method according to claim 2, wherein the waveguide formed in the silicon layer comprises an integrated planar index contrast waveguide (ICWG) formed outside the grating region, the method further comprising coupling of light from the grating region to guided modes of the ICWG.

5. A method according to claim 1, wherein an effective cavity length $d_{eff}$ of the VCL cavity and there by the lasing wavelength $\lambda$ is controlled by controlling a thickness of the lower index layer between the layered structure and the grating region.

6. A method according to claim 1, wherein a position of an optical gain region of the VCL is defined after the layered structure is arranged on the grating region.

7. A hybridized vertical-cavity laser (VCL) structure comprising:
   a layered structure comprising an active region formed in group III-V materials and a highly reflective top mirror that is not used as an out-coupling mirror and that has a reflectivity larger than 99.5%; and
   a grating region formed in a silicon layer supported by a supporting layer with lower refractive index, the grating region comprising a 1D or 2D periodic refractive index grating formed by silicon layer parts and regions being formed in the silicon layer and having refractive indices lower than the refractive index of the silicon layer;
   a layer with refractive index lower than the refractive index of the silicon layer provided on top of the grating region of the silicon layer;
   where the layered structure is arranged on the grating region so that the periodic refractive index grating establishes a bottom grating-mirror forming a VCL cavity between the top mirror and the grating region, the bottom grating-mirror having a reflectivity greater than 99%, the bottom grating-mirror also facilitating coupling of light in modes of the VCL cavity to in-plane modes of the grating region, wherein the supporting layer has a refractive index $n_{supp}$ and a thickness of at least $\lambda/2n_{supp}$ to vertically confine light to the grating region and to avoid undesirable evanescent coupling to lower layers, and
   a waveguide formed in the silicon layer of the grating region and having an end face formed within or abutting the grating region to facilitate coupling of light from the grating region to the waveguide.

8. The hybridised VCL structure according to claim 7, wherein the lower index layer between the layered structure and the grating region is an oxide layer formed on the layered structure.

9. The hybridized VCL structure according to claim 7, wherein the lower index layer between the layered structure and the grating region comprises air, and wherein the layered structure comprises one or more mesas resulting in an air gap when the layered structure is arranged on the grating region.

10. The hybridised VCL structure according to claim 7, wherein the end part of the waveguide formed in the silicon layer comprises a grating waveguide (GWG) formed within the grating region, the GWG being arranged to facilitate coupling of light from the grating region to the GWG.

11. The hybridized VCL structure according to claim 10, wherein a connecting part of the GWG is topologically optimized to reduce scattering losses.

12. The hybridized VCL structure according to claim 10, wherein the GWG is shaped to match dispersion of modes in the GWG to modes in the periodic refractive index grating.

13. The hybridized VCL structure according to claim 7, wherein the waveguide formed in the silicon layer comprises an integrated planar index contrast waveguide (ICWG) formed in the silicon layer outside the grating region and arranged to facilitate coupling of light from the grating region to the ICWG.

14. A silicon-based grating mirror with a laterally oriented waveguide comprising
- a silicon layer being supported by a supporting layer with lower refractive index;
- a grating region comprising a 1D or 2D periodic refractive index grating formed by silicon layer parts and regions being formed in the silicon layer that have refractive indices lower than the refractive index of the silicon layer;
- at least part of the grating region forming a grating-mirror for reflecting normally incident light with a reflectivity greater than 99% and couple normally incident light to in-plane modes of the grating region, wherein the supporting layer has a refractive index $n_{supp}$ and a thickness of at least $\lambda/2n_{supp}$ to vertically confine light to the grating region and to avoid undesirable evanescent coupling to lower layers; and
- a waveguide formed in the silicon layer of the grating region and having an end face formed within or abutting the grating region to facilitate coupling of light from in-plane modes of the grating region to the waveguide.

15. A layered structure and a silicon platform substrate for receiving the layered structure;
- the layered structure comprising an active region formed in group III-V materials and a highly reflective top mirror that is not used as an out-coupling mirror and that has a reflectivity larger than 99.5%;
- the silicon platform substrate being supported by a supporting layer with lower refractive index and comprising a grating region comprising a 1D or 2D periodic refractive index grating formed by silicon layer parts and regions being formed in a silicon layer and having refractive indices lower than the refractive index of the silicon layer; and
- a waveguide formed in the silicon layer of the grating region and having an end face formed within or abutting the grating region to facilitate coupling of light from the grating region to the waveguide;
- where at least one of the layered structure or the grating region comprises or involves a structuring that will provide a layer with refractive index lower than the refractive index of the silicon layer above the grating region when the layered structure is arranged on the grating region, such that the periodic refractive index grating establishes a bottom grating-mirror to form a vertical-cavity laser (VCL) cavity between the top minor and the grating region, and wherein the bottom grating-minor has a reflectivity greater than 99%, wherein the supporting layer has a refractive index $n_{supp}$ and a thickness of at least $\lambda/2n_{supp}$ to vertically confine light to the grating region and to avoid undesirable evanescent coupling to lower layers.

16. The method according to claim 1, wherein the bottom grating-minor has a reflectivity larger than about 99.5%.

17. The hybridized VCL structure according to claim 7, wherein the bottom grating-minor has a reflectivity larger than about 99.5%.

18. The grating-mirror according to claim 14, having a reflectivity larger than about 99.5%.

19. The layered structure and silicon platform substrate according to claim 15, wherein the bottom grating-mirror has a reflectivity larger than 99.5%.

* * * * *